United States Patent [19]
Pantigny et al.

[11] Patent Number: 5,742,058
[45] Date of Patent: Apr. 21, 1998

[54] DEVICE AND A METHOD OF DIGITALIZATION FOR PHOTOSENSITIVE DETECTORS AND A METHOD OF READING A MATRIX OF PHOTONIC DETECTORS

[75] Inventors: Philippe Pantigny, Claix; Patrick Audebert, Grenoble; Eric Mottin, St Martin le Vinaux; Frédéric Rothan, Fontaine, all of France

[73] Assignee: Commissariat A l'Energie Atomique, Paris, France

[21] Appl. No.: 655,670

[22] Filed: May 30, 1996

[30] Foreign Application Priority Data

Jun. 14, 1995 [FR] France ................................. 95 07079

[51] Int. Cl.[6] ............................... H05G 1/64; G01T 1/24
[52] U.S. Cl. ............... 250/370.08; 250/332; 250/370.09; 250/578.1
[58] Field of Search ........................ 250/578.1, 370.09, 250/370.08, 332

[56] References Cited

U.S. PATENT DOCUMENTS

| | | | |
|---|---|---|---|
| 4,953,028 | 8/1990 | Murayama et al. | 348/308 |
| 5,168,528 | 12/1992 | Field, Jr. | 382/103 |
| 5,324,944 | 6/1994 | Soch et al. | 250/338.3 |

FOREIGN PATENT DOCUMENTS

| | | | |
|---|---|---|---|
| 0429977 | 6/1991 | European Pat. Off. | 250/370.09 |
| WO 87/05457 | 9/1987 | WIPO. | |

OTHER PUBLICATIONS

1990 IEEE International Symposium on Circuits and Systems, vol. 3 of 4, pp. 1705–1708, May 1–3, 1990, K. Chen, et al., "PASIC: A Processor–A/D Converter–Sensor Integrated Circuit".

*Primary Examiner*—Constantine Hannaher
*Attorney, Agent, or Firm*—Oblon, Spivak, McClelland, Maier & Neustadt, P.C.

[57] ABSTRACT

A device and a method of digitalisation for at least one photosensitive detector (DET(i,j)), which supplies a current, the intensity of which varies in relation to the incident flux, and a method for reading a matrix of photonic detectors. The device includes an assembly of elementary points (PEL(i,j)) which enables the signals supplied by each detector to be read. The quantity processed is the charge, each elementary point carrying out a preintegration of the current supplied by a corresponding detector and at least one information processing chain, including a regeneration device which carries out a reading of the resultant charge quantity in the form of a current pulse so as to package the signals supplied by the detectors; the signals coming from the processing chain(s) being multiplexed to at least one digital output.

13 Claims, 11 Drawing Sheets

DEVICE AND A METHOD OF DIGITALIZATION FOR PHOTOSENSITIVE DETECTORS AND A METHOD OF READING A MATRIX OF PHOTONIC DETECTORS

DISCLOSURE

TECHNOLOGICAL FIELD

This invention relates to a device and a method of digitalisation for photosensitive detectors, and a method for reading a matrix of photonic detectors.

STATE OF PRIOR ART

The field of the invention is that of radiation detection devices, particularly radiation emitted at infrared, visible and X-ray wavelengths.

The invention relates, more particularly, to a specific reading circuit architecture with a view to digitalizing the signals coming from the detectors.

Photosensitive sensors operating within the X-ray to infrared range of the spectrum are meant for imaging or for information processing particularly with a view to scientific applications. The signal coming from this sensor is generally of the analog type and is supplied by an output amplifier. This signal is then digitalized outside of the sensor to be used in the processing chain.

STATE OF THE ANALOG ART

The photonic detection devices to which the invention relates are of two types:

quantum;
thermal.

In quantum detectors, the photons received by the detector are converted into electrons and/or holes according to the intrinsic detection principle (direct transition, valence band to conduction band) or extrinsic (transition between intermediate level and conduction band). The quantum detectors can be grouped together into two categories:

photovoltaic detectors the current intensity of which varies as a function of the incident flux photoconductive detectors the resistance of which varies as a function of the incident flux.

The thermal detectors can also be grouped together into two categories:

bolometric resistive detectors, the resistance varies as a function of the energy of the incident radiation;

diode detectors, the current intensity of which varies as a function of the incident flux.

The quantum detectors and the thermal detectors can each be assimilated to a more or less ideal current generator which supplies a current whose intensity varies as a function of the incident flux, provided that the detectors are suitably polarised.

In cameras relevant to the invention, the images are made either from linear arrays of detectors, in other words, detectors set up at a regular distance apart in one single direction, which must be scanned or from mosaics or matrices, in other words, detectors set up as a matrix, which are not scanned in the majority of cases.

In view of the number of detectors used in present day cameras and in view of the distance between detectors, it is absolutely necessary to use a specific circuit, that will be referred to, in the following, as the reading circuit, to package the signal supplied by the detector and multiplex it to a restricted number of information processing chains.

Each detector can be produced, either directly on the reading circuit or on another circuit. In the first case, one refers to it as a monolithic component and in the second case as a hybrid component since the detection circuit detectors are interconnected to the input stages of the reading circuit by suitable technology such as hybridisation by beads.

The invention relates to a reading circuit architecture particularly suited to the reading of a mosaic of:

quantum detectors made on a substrate other than that of the reading circuit and consequently, hybridised to this reading circuit;

thermal detectors produced directly on the reading circuit.

Several prior art reading circuits will now be described.
Reading circuits of the charge transfer type The reading circuits of the charge transfer type are manufactured in specific dies which allow charge transfer devices to be made.

The block diagram showing these circuits is given in FIGS. 1A and 1B.

At each elementary point shown on FIG. 1A, there is:

a switch or an impedance matching device AI between a detector and a MOS capacitor;

a Cpel MOS capacitor ("Conception de circuits intégrés MOS" published by Eyrolles) the inversion channel of which is used as a storage element;

a switch that controls the injection of the charges stored in the elementary points into a charge transfer register channel;

a reset device (RAZ) for the storage element

The multiplexing of the charges stored in the elementary points to one or several outputs is carried out using two types of charge transfer register:

the parallel registers RPj which multiplex the elementary points of one column to a series register input;

the series register(s) RS which multiplex the charges coming from the parallel registers to output stage(s) of an output from the reading circuit.

For each frame, all charge is evacuated from the inversion channel of the integrating capacitor using a reset device. The current output from each detector of the mosaic is then integrated during the exposure time in the inversion channel of the integrating capacitor.

The integrated charge $Qpel_{ij}$ in the storage capacitor Cpel of the elementary point PEL(i,j) is related to the intensity $Id_{ij}$ of the output current from the detector DET(i,j) and to the exposure time, by the expression:

$$Qpel_{ij} = Id_{ij} \times Tpose$$

All or part of the charge stored in each of these integrating capacitors is then fetched by different techniques and multiplexed using charge transfer devices to output stage(s). It is in the output stage that the charges are converted into voltage by injection into a suitably polarised capacitor. The voltage at the terminals of this capacitor is read by a voltage amplifier with a very high input impedance and low output impedance.

The expression of the amplitude $\delta Vs_{ij}$ of the output voltage pulse corresponding to the reading of the elementary point PEL(i,j), is given by the expression:

$$\delta Vs_{ij} = Aq \times Id_{ij} \times Tpose/Cs$$

where Cs is the charge voltage conversion factor of the output stage and Aq the gain of the circuit charges.

These reading circuits have the advantage of having an identical and synchronous exposure time for all detectors.

On the other hand, they are not compatible with random addressing of the detectors, which prevents the creation of underlying images.

The reset device is only absolutely necessary if the whole of the integrated charge cannot be transferred into the parallel register.

These reading circuits finally have the major disadvantage of having to be made in specific dies whose integrating density is less than that of classic CMOS dies while the spacing of the detector mosaics is much reduced.

Reading circuits of the switched follower type

For reading circuits of the switched follower type described, in particular in references [1], [2] and [3] quoted at the end of the disclosure, a block diagram is given in FIGS. 2A and 2B.

At each elementary point shown in FIG. 2A, there is at least

- a switch or an impedance matching device AI between a detector DET(i,j) and an integrating capacitor;
- a capacitor Cpel made using an MOS transistor whose gate-source capacitance allows the conversion of current into voltage by integration;
- a switch to reinitialise the integrating capacitor at each frame carried out using MOS transistors;
- a voltage amplifier Apel with high input impedance which allows the reading of the voltage at the terminals of the integrating capacitor and the driving of an output amplifier at low impedance;
- a switch that allows switching of the elementary point amplifier output onto a connection common to the elementary points of the same column, called a column bus BCj.

The multiplexing of the column buses BCj to one or several output amplifiers As is carried out using switches embedded at the ends of each column bus.

Each frame, the voltage at the terminals of the integrating capacitor is first of all reinitialised using the reset switch. The current from the detector is then integrated in the integrating capacitor during a time period Tpose. At the end of the integration time, the output of the amplifier of the elementary point is switched onto the column bus and onto the output amplifier using elementary point and multiplexer line switches, appropriately sequenced.

The expression for the voltage variation $\delta Vpel_{ij}$ at the terminals of the integrating capacitor of the elementary point PEL(i,j) as a function of the current $Id_{ij}$ from the detector DET(i,j) of this elementary point is given by the expression:

$$\delta Vpel_{ij} = Id_{ij} \times Tpose/Cpel$$

where Cpel is the capacitance of the storage capacitor of the elementary point.

The variation of the output voltage $\delta Vpel_{ij}$ corresponding to the reading of the elementary point PEL(i,j) is given by the equation:

$$\delta Vs_{ij} = Apel \times As \times \delta Vpel_{ij} = Apel \times As \times Id_{ij} \times Tpose/Cpel$$

where Apel (respectively As) is the gain in voltage of the voltage amplifier of the elementary point (respectively of the output amplifier).

This type of circuit architecture has the advantage of being compatible with random addressing of the elementary points, in other words, the creation of underlying images.

A first limitation is linked to the mode of reading the detectors. In fact, in the case where the exposure time must be identical and synchronous for all the detectors, it is necessary to sample and block the voltage at the terminals of the storage capacitor in the elementary point. This operation imposes extra constraints on the design of the elementary point which it is all the more difficult to satisfy since the spacing of the elementary point is small. In particular, the surface of the storage capacitor and hence its capacitance decreases. The reduction in the storable charge then translates itself into a worsening of the signal to noise ratio.

Another limitation of this type of architecture is linked to the rate of reading which imposes dimensioning constraints on the elementary point voltage amplifier and on the switch which permits the connection between the elementary point outputs in the same column to the output amplifier. Indeed, the set-up time of the signal at the elementary point amplifier output must be less than the output period of the video signal. In practice, it is necessary that:

- the elementary point amplifier is capable of supplying a high current;
- the switch resistance is sufficiently low that it does not decrease, to any significant extent, the voltage gain of the amplifier;
- the capacitive coupling arising from the divider point between the input-output capacitance of the elementary point amplifier and the storage capacitance is such that the sampled-blocked voltage at the elementary point amplifier input is not modified in any significant way.

These constraints are the more difficult to satisfy when the number of detectors increases and the spacing of the elementary points decreases while the image rate stays constant and the number of outputs has rather a tendency to decrease.

Finally it is absolutely necessary to integrate into the elementary point a specific device to carry out the function of resetting the elementary point, which necessitates at least one more transistor.

Reading circuits of the column bus partition type

For reading circuits of the column bus partition type, a block diagram is given in FIGS. 3A and 3B.

At each elementary point shown in FIG. 3A there is at least:

- a switch or an impedance matching device AI between a detector DET(i,j) and an integrating capacitor;
- a capacitor Cpel whose capacitance, either that of the inversion channel of a MOS capacitor, or the gate-source capacitance of a MOS transistor allows the conversion of the current to voltage by integration;
- a switch that allows switching of one terminal of the elementary point integrating capacitor onto a connection common to the elementary points of the same column, called a column bus BCj.

A voltage amplifier Abc with high input impedance but with low input capacitance, is embedded at the end of each column bus BCj, as well as a reset switch for the integrating capacitors.

The multiplexing of the outputs from these voltage amplifiers to one or several output amplifiers As is carried out using switches embedded at the output of each of these amplifiers.

The multiplexing of the outputs from these voltage amplifiers to one or several output amplifiers is carried out using switches embedded at the output of each of these amplifiers.

For each frame, the current from the detector is integrated in the integrating capacitor during a time period Tpose. At the end of the integration timer a line is selected and the switches of the elementary points of this line are closed on the interconnection buses which have been previously, suitably initialised. The system formed by the storage capacitor and the column bus being isolated, the final voltage of the column bus is a function of its capacity and its storage capacity. While this voltage is stabilised, the output voltage of the column amplifiers is multiplexed to the output amplifier(s). It is then possible to reinitialise the integrating capacitor of a line using the reset switches situated at the end of each column bus.

The charge $Qpel_{ij}$ integrated in the elementary point PEL(i,j) as a function of the current $Id_{ij}$ of the elementary point detector and the exposure time Tpose is given by the expression:

$$Qpel_{ij}=Id_{ij}\times Tpose$$

The voltage variation $\delta Vbc_{ij}$ of the column bus after switching of the elementary point capacitor PEL(i,j) is obtained by writing the charge conservation equation (here, it is assumed that the initial charge on the column bus is zero):

$$\delta Vbc_{ij}=Qpel_{ij}/(Cpel+Cbc)=Id_{ij}\times Tpose/(Cpel+Cbc)$$

where Cpel (respectively Cbc) is the capacitance of the storage capacitor in the elementary point (respectively capacitance of the column bus).

The output voltage variation $\delta Vbc_{ij}$ corresponding to the reading of the information supplied by the elementary point PEL(i,j) is given by the following equation:

$$\delta Vs_{ij}=As\times Abc\times\delta Vbc_{ij}=As\times Abc\times Id_{ij}\times Tpose/(Cpel+Cbc)$$

where Abc (respectively As) is the voltage gain of the voltage amplifier of a column bus (respectively of the output amplifier).

The advantages and disadvantages of this architecture are almost the same as those for the switched follower structure with the difference that the disadvantages linked to the presence of the amplifier disappear. As for the reset of the elementary point, it is not absolutely necessary to embed a specific device in the elementary point since it is possible to reinitialise the integrating capacitor via the column bus.

It is however necessary that the user adapts to the reduction of gain due to attenuation of the signal controlled by the value of the capacitance of the column bus. This point can be absolutely crippling in terms of signal to noise ratio for large format circuits, at high Cbc and/or for applications where the charge to be handled is small.

Reading circuits of the external integration type

For reading circuits of the external integration type such as those described, in particular, in references [4] and [5] quoted at the end of the disclosure, a block diagram is given in FIGS. 4A and 4B.

In each elementary point, since the impedance matching device AI is not always absolutely necessary, there is a minimum of a switch that allows switching of the detector DET(i,j) onto a connection common to the elementary points on the same column, called a column bus BCj. Then, at the end of each column, there is a charge amplifier Ac, i.e. a voltage amplifier with negative feedback by a capacitor.

The multiplexing of the outputs of these charge amplifiers Ac to one or several output amplifiers As is carried out by switches embedded at the output of each of these charge amplifiers.

For each frame, the lines of detectors are selected one after the other. At the desired instant, the detectors in the addressed line are switched onto the column buses, closing the switches embedded in the elementary points of the relevant line, during a time equal to the exposure time (Tpose).

The current $Id_{ij}$ supplied by the detector DET(i,j) is integrated during Tpose by the charge amplifier connected to the column bus BCj. At the end of the exposure time, the output voltage of the charge amplifier is read by the acquisition chain. Another line can then be selected when the charge amplifiers have been appropriately reinitialised.

The output voltage variation $\delta Vc_{ij}$ of the charge amplifier Acj on which the detector DET(i,j) has been switched, is given by the equation:

$$\delta Vc_{ij}=Id_{ij}\times Tpose/Ca$$

where Ca is the capacitance of the negative feedback capacitor of the charge amplifier.

The output voltage variation $\delta Vs_{ij}$ corresponding to the reading of the information supplied by the elementary point PEL(i,j) is given by the following equation:

$$\delta Vs_{ij}=As\times\delta Vc_{ij}=As\times Id_{ij}\times Tpose/Ca$$

where As is the voltage gain of the output voltage amplifier.

This architecture only requires one switch per elementary point from which its field of application in mosaics with reduced spacing derives. In particular, a reset switch is not indispensable in the elementary point.

On the other hand, it is clear that this type of architecture is not compatible with an identical and synchronous exposure time for all the elementary points.

Furthermore, this architecture imposes a constraint on the exposure time which must be less than or equal to the period of the output video signal divided by the number of lines to be read. This constraint limits the signal to noise ratio of this type of reading circuit for applications with a large number of points and a reduced number of outputs.

State of the art of the analog/digital conversion in the focal planes

A limitation of the performance of these sensors in terms of signal to noise ratio arises from the transmission of the analog signal outside the focal plane.

Furthermore, the processing of the information is easier to carry out in digital form than in analog form. For example, a digital signal in the focal plane allows the possibility of carrying out more easily operations such as TDI (Time Delay Integration) or averaging, with a view to increasing the signal to noise ratio.

Analog-digital conversion in a focal plane is realised by directly embedding one or several converters in the focal plane (see references [7] and [8]). The main limitations to this solution stem from the consumption of electrical power, the size of the chip, the resolution and the speed of conversion of the converter(s), the technological complexity and the development cost of such architecture which can necessitate, in certain cases the use of "Z technology" (see reference [9])

There is a wide variety of converters. One may mention, for example:

"flash" converters;
"successive approximation" converters;
"simple or double ramp" converters;
"sigma-delta" converters.

Generally these converters are used in parallel where a converter is located at the end of each column of the imager. Apart from the case of a signal having an dynamic output range greater than the dynamic analog ranges manageable at the output of a focal plane, a single converter in the focal plane will never be a performance alternative to conversion outside the focal plane, in terms of speed, of resolution and of electrical power consumption.

Given the lack of space, and the low tolerable electrical power consumption in a focal plane, these converters are often unsuitable for digital conversion in an imaging sensor.

The object of the invention is a device and a method for reading photosensitive detectors that allows analog-digital conversion to be carried out on each photosensitive detector while freeing it from the congestion and consumption problems due to the converter(s).

DESCRIPTION OF THE INVENTION

This invention relates to a device for reading a matrix of photosensitive detectors, which supplies a current whose intensity varies as a function of the incident flux, the exposure time being identical and synchronous for all the detectors, characterised in that it includes an assembly of elementary points allowing the reading of signals supplied by each detector, each elementary point carrying out a pre-integration of the current supplied by a corresponding detector in a way that generates a quantity of charge. A resulting reading of the quantity of charge is carried out in the form of a current pulse by at least one information processing chain including a regeneration device, in a manner that packages the signals supplied by the detector matrix. The signals coming from the processing chain(s) are multiplexed to at least one digital output. The regeneration device is external to the elementary point in the case of a matrix of detectors. In the case of a linear array of detectors, the regeneration device is situated either outside or inside the elementary point.

Advantageously, the photonic detectors are quantum detectors or thermal detectors. They are produced on a substrate other than that of said reading device or directly on the reading device circuit.

The invention relates to a circuit for reading a signal supplied by at least one detector, for example having a high reading rate, the exposure time being identical and synchronous for all the detectors, characterised in that it includes an assembly of elementary points divided up into lines and columns in a way that describes a matrix.

Advantageously, each elementary point is made up of:
an impedance matching device, fitted with a first clock capable of polarising the detector and of reading the current supplied by the detector;
at least one MOS transistor, provided with a second clock capable on the one hand of integrating the current supplied by the detector, and on the other hand of storing the charge obtained, and finally bound to an addressing device, and capable of evacuating this charge, in the form of a current pulse, onto a regeneration device which transforms this current pulse into a binary type signal, this regeneration device being external to the elementary point;
the addressing device, provided with a third clock, capable of switching the source and/or the drain of the MOS transistor onto a connection common to the elementary points in the same column, called a column bus.

Each column bus is linked to a processing chain including the following means:
said signal regeneration device capable of reading and of converting the current pulse coming from an elementary point into a binary type signal, during a signal from the second clock, in a simultaneous fashion and doing this for each point in the same line, the lines being processed one after another;
a counter provided with a fourth clock which counts the clock pulses during the duration of the signal from the regeneration device;
a device for reading the digitised signal.

The impedance matching device is connected through its input to the detector, through its output to the source and/or drain of the MOS transistor and by its command to the first clock which switches between a disabling voltage and a polarisation voltage.

The gate of the MOS transistor is connected to the second clock which switched to a certain voltage allows evacuation of the charge stored on a common connection and, switched to another voltage, integrates the current coming from the detector and stores the charge obtained.

The addressing device is connected, by its input to the source and/or drain of the MOS transistor, by its output to the column bus and by its command to a third clock which switches between a disabling voltage and a voltage for which the addressing device is enabled. In the particular case where the addressing device is a transistor, it is capable of generating a potential barrier between the potential of its channel and that of the MOS transistor.

The current regenerating device is connected at its input to the column bus and at its output to the counter.

The counter is connected at its output to the device for reading the digitised signal.

Advantageously, a data storage device is connected between the counter and the device for reading the digitised signal.

The storage device can be a random access memory (RAM).

The memory at the counter output can be a D type flip-flop.

The analog signal regenerating device can be a current/voltage amplifier.

The purpose of the invention is to simplify the electronics of a reading circuit while removing from the elementary points, the reset devices present in the pixel of prior art devices. Nevertheless, this function is kept but it is carried out by the regenerating device outside the elementary point. The invention also has the aim of supplying digital type information obtained in a very simple fashion.

In the case of a linear array of detectors, there is no common connection. There are as many current regenerating devices (for example current/voltage amplifiers) as there are lines in the linear array. The multiplexing is limited to multiplexing the counter outputs.

The device of the invention allows digital information to be obtained which can be used directly by the image processing method.

The invention allows the conversion of analog information from the detector obtained at the output of a MOS transistor, into digital information. For that a counter is added which is triggered as soon as the current pulse is present on the column bus and stops when the pulse is finished.

Advantageously, the impedance matching device is a MOS transistor. The addressing device is a MOS transistor used as a switch, the analog level being applied to its gate to enable it and such that the absolute value of the gate-source potential difference is slightly greater than the absolute value of the threshold voltage of the MOS transistor.

Advantageously, the set-up time for the output signal from the regenerating device is less than the decay time of the clock which drives the transistor gate. In the case of a linear array of detectors, either there is a common connection and a single regenerating device, or there is no common connection and as many regenerating devices and counters as lines in the linear array, the multiplexing being limited to the multiplexing of the signals coming from the counters.

Advantageously, the voltage that permits storage of the charges is the earth for a PMOS transistor and is equal to the supply voltage for a NMOS transistor.

The fundamental properties of the elementary points of this architecture are the following:

to have an exposure time of the same duration and synchronous for all the elementary points;

to pre-integrate the current $id_{ij}$ supplied by the detector $D_{ij}$ during the exposure time $T_{pose}$, in the form of a packet of charges $Q_{ij}$.

$$Q_{ij} = T_{pose} \times id_{ij}$$

to convert, at the elementary point output, the quantity of integrated charges, into a current pulse of adjustable and constant amplitude $I_{pulse}$ for all the elementary points of a mosaic, and of duration $\delta t_{ij}$ proportional to the quantity of stored charge $$Q_{ij} = I_{pulse} \times \delta t_{ij} = T_{pose} \times Id_{ij}$$

thus $$\delta t_{ij} = (T_{pose}/I_{pulse}) \times Id_{ij}$$

To summarise, this architecture supplies, at the output of these elementary points, a current pulse of constant amplitude for all the elementary points and of duration proportional to the mean current of each detector in the integrated mosaic during an exposure time synchronous and identical for all the detectors.

This invention also, relates to a method of reading a matrix of photonic detectors, which supplies a current the intensity of which varies as a function of the incident flux, characterised in that it includes the following steps:

conversion of the current from the detector into charge by integration of a duration equal to the exposure time;

conversion of the integrated charge into a pulse of current whose amplitude is adjustable as a function of a stimulus and whose duration varies as a function of the stored charge;

digitalisation of this pulse of current into a voltage, by means of, in particular, a counter.

Advantageously, it comprises the following steps:

The first clock Hp being at the polarisation voltage level Vpol, the second HCi (i is the number of the lines) being at the level allowing storage of the charge and the third at the disabling voltage: one time per image, there is an integration of the current supplied by the detector in the MOS transistor (storage) during a time pre-defined as a function of the illumination conditions of the scene, the characteristics of the detector and the value of the storage capacity.

The first clock Hp returning to its disabling voltage; the second clock HCi changing in a linear fashion from the level allowing the storage of charge to the level disabling the transistor (the rate of change being determined with respect to the characteristics of the regenerating device); and, the third clock HAi switching to the V screen level; a charge evacuation step carried out for each line of the matrix at the time of reading and digitalisation of the signal; the second clock HCi being at the disabling voltage; the third clock HAi switching to the disabling voltage and one starts again for the following line.

When all the lines have been scanned, the preceding steps are started again for another image.

In the invention, the width of the current pulse is digitised in order to convert the analog signal into a digital signal by a technique used commonly in other sensors. In order to do this, the signal processing chain is modified from the charge amplifier which is replaced by a binary counter.

The analog-digital conversion of the information contained in an image from a synchronously exposed mosaic, is carried out, in a simple way, in the focal plane.

DETAILED DESCRIPTION OF THE EMBODIMENTS

Figure 1A:
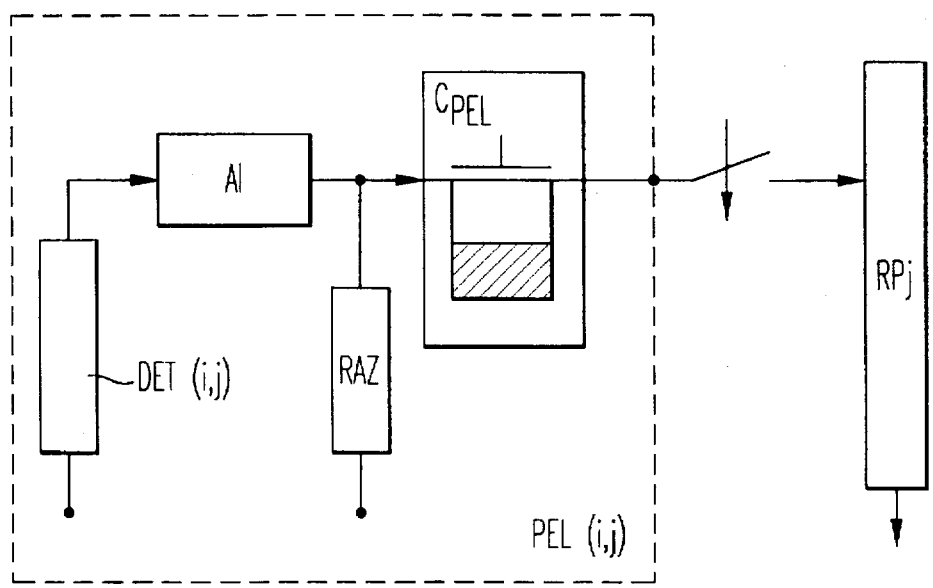
FIGS. 1A and 1B illustrate an architecture of a prior art reading circuit of the charge transfer type.
Figure 1B:
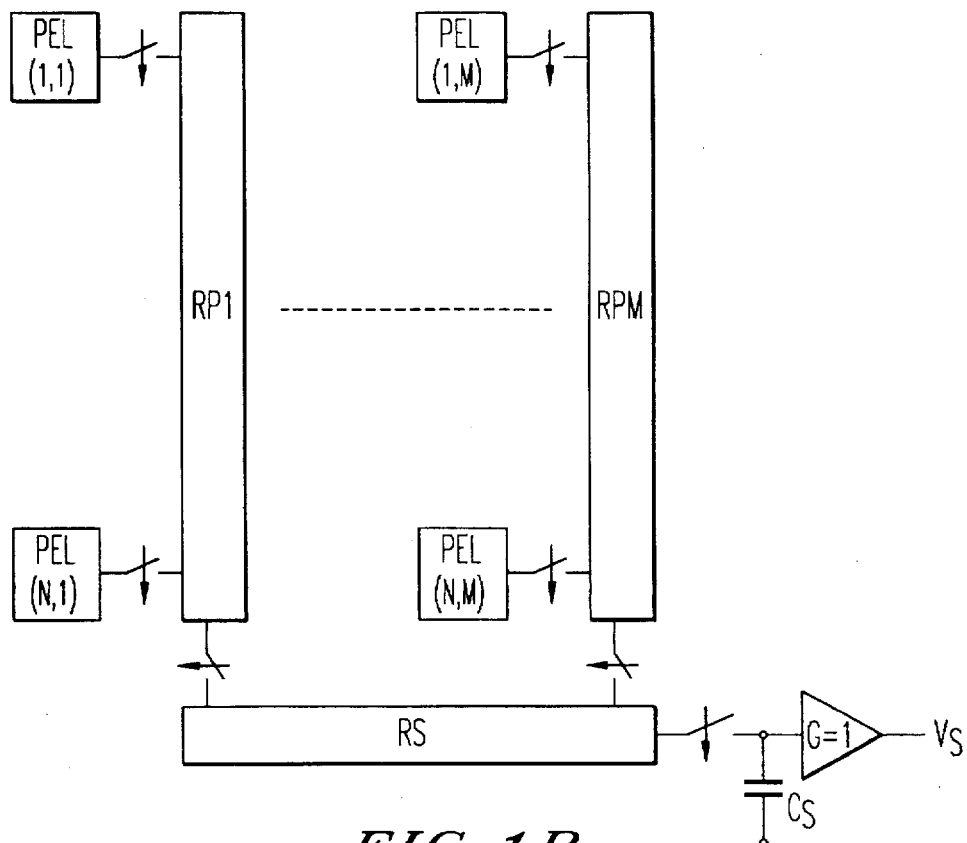
Figure 2A:
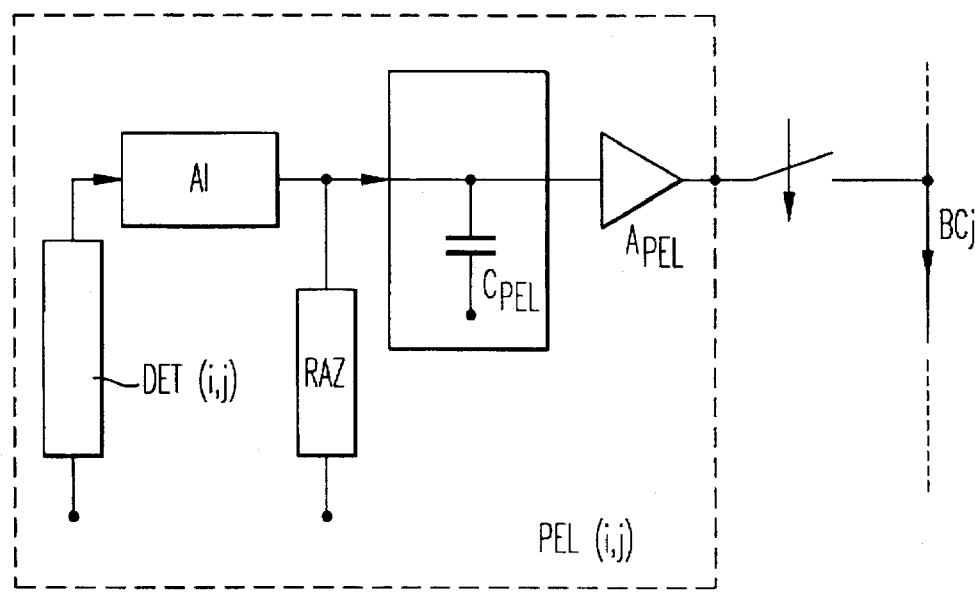
FIGS. 2A and 2B illustrate an architecture of a prior art reading circuit of the switched follower type.
Figure 2B:
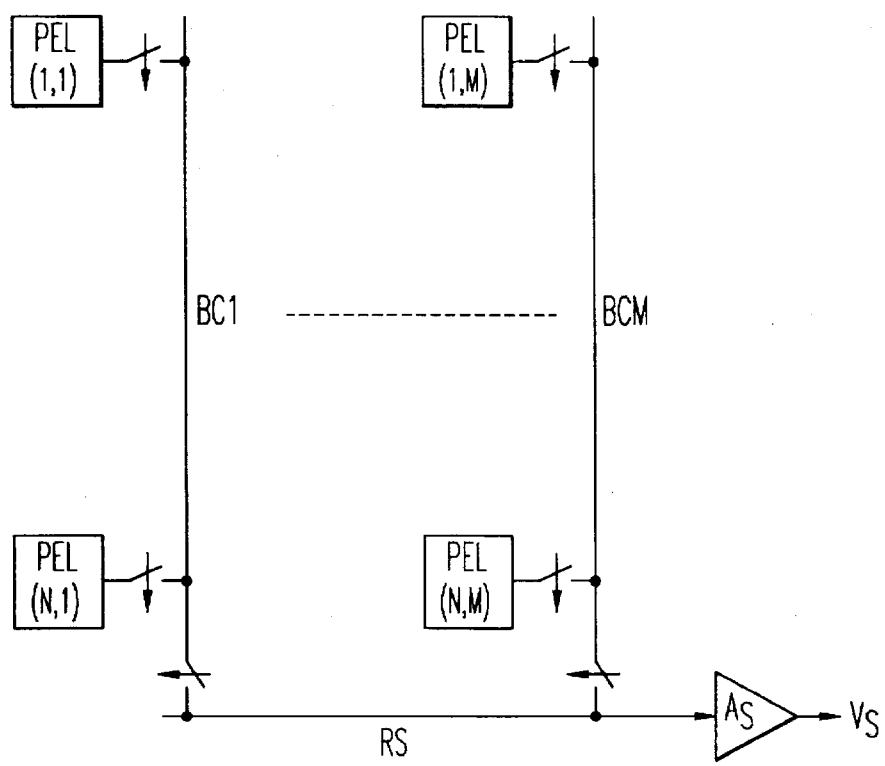
Figure 3A:
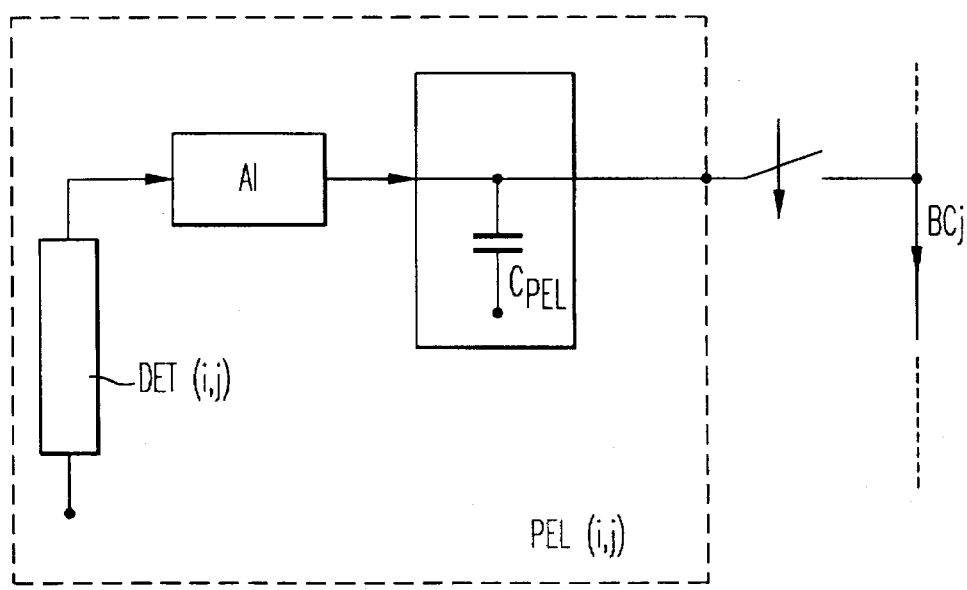
FIGS. 3A and 3B illustrate an architecture of a prior art reading circuit of the column bus partition type.
Figure 3B:
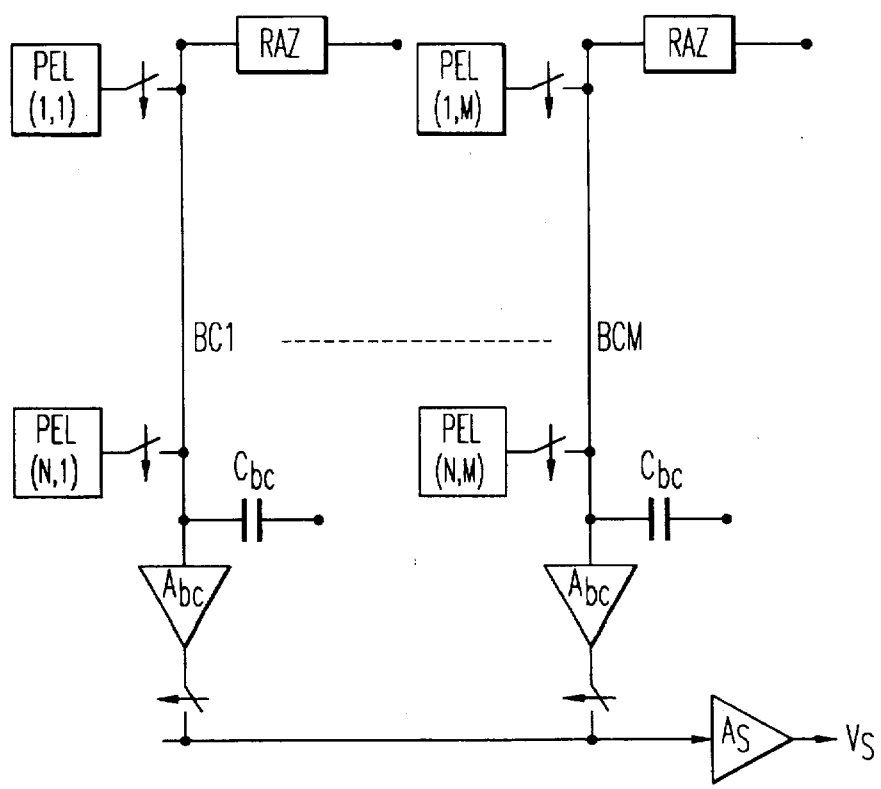
Figure 4A:
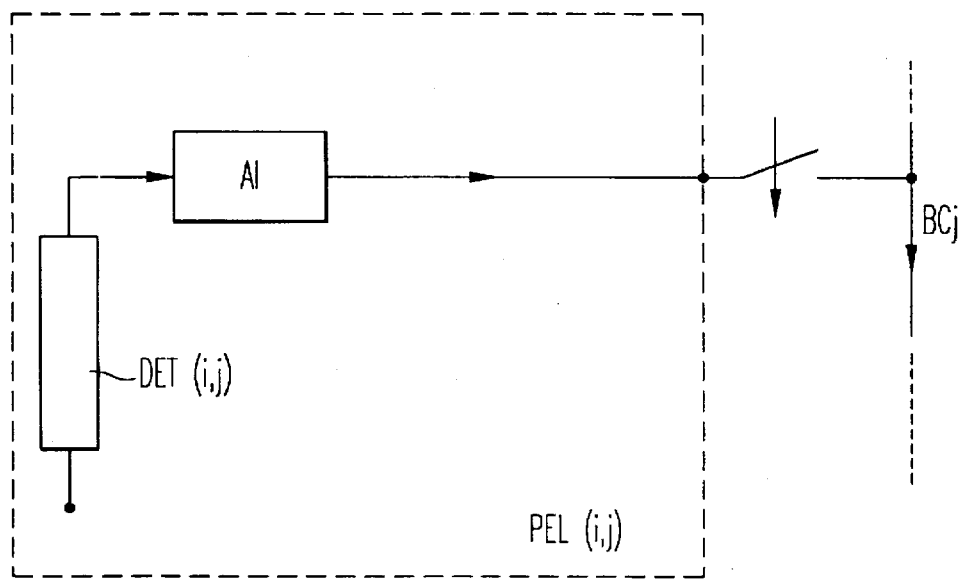
FIGS. 4A and 4B illustrate an architecture of a prior art reading circuit of the external integration type.
Figure 4B:
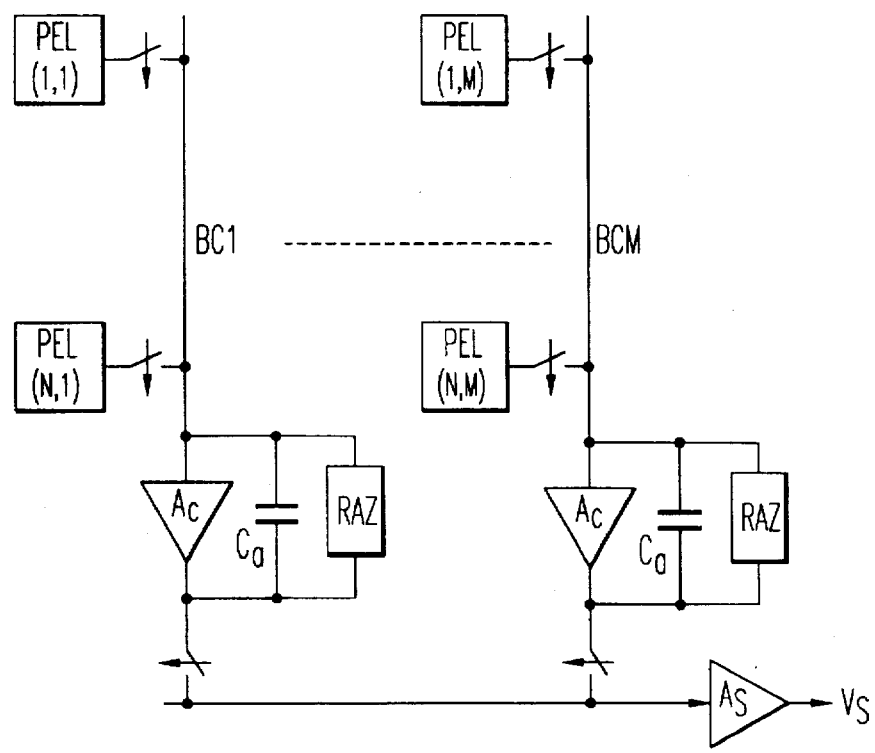
Figure 5A:
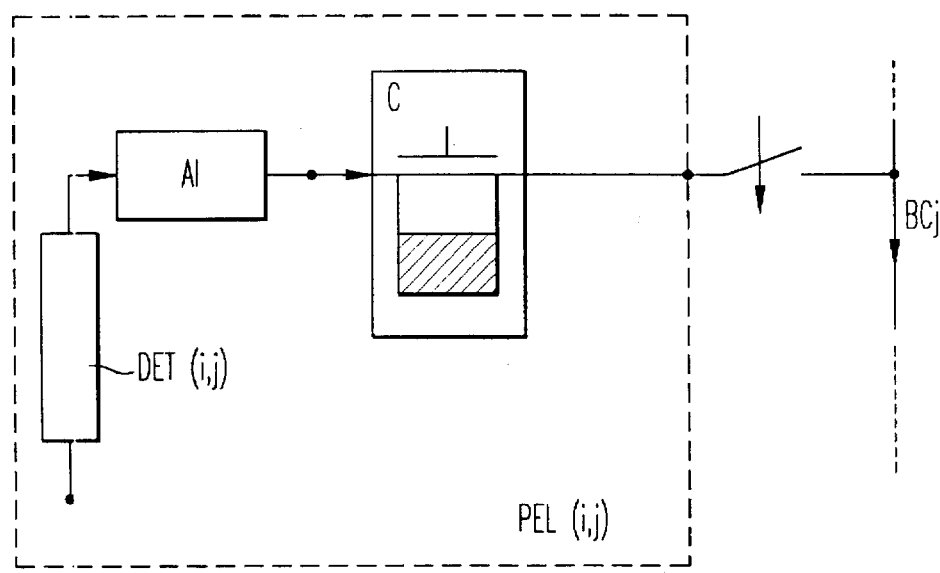
FIGS. 5A and 5B illustrate an architecture of a reading circuit according to the invention.
Figure 5B:
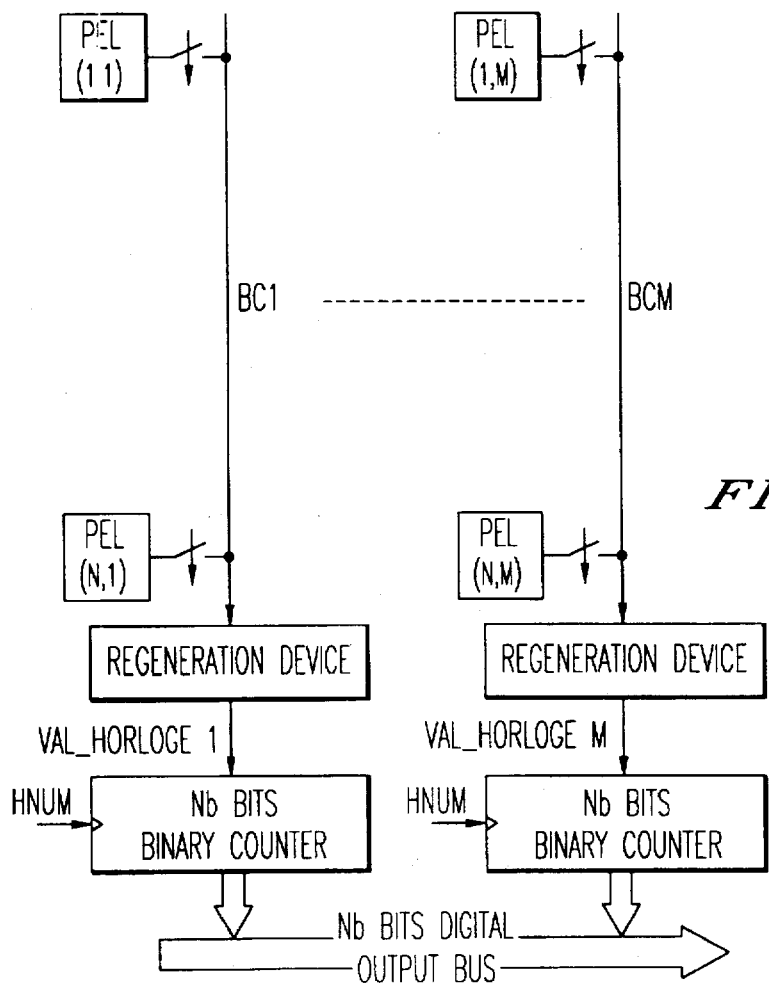

The circuit architecture according to the invention is shown in FIGS. 5A and 5B for the case of a matrix of N lines by M columns, FIG. 5A representing the detail of an elementary point.

The reading circuit has exactly the same form as an SCA type, analog, reading circuit for everything relating to the architecture of the elementary points, their connection onto the different column buses and the timing diagrams of the command clocks for the devices forming the assembly of elementary points, all this being concerned with arranging the fundamental characteristic of the current pulses coming from the elementary points onto the column buses.

In each elementary point, there is:

an impedance matching device between the detector and the storage capacitor (if necessary);

a storage capacitor made using a MOS transistor whose source and/or drain are connected to the detector via a switch and whose gate is driven by a clock;

an addressing device, symbolised, in the interests of simplification by a switch, which allows switching of the source and/or the drain of the MOS storage transistor onto a common connection to the elementary points of the same column, referred to as a column bus.

For each column, modifications to the architecture only appear at the end of the column bus where the charge amplifier is replaced by a current pulse regeneration device. This supplies a signal VAL_HORLOGEj of identical duration to the current pulse coming from the elementary point and of an amplitude compatible with the command signals from the binary counter. The VAL_HORLOGEj signal is used to validate the counter clock HNUM, during the duration of the current pulse. In this way the counter carries out the analog-digital conversion of the mean current from the integrated detector during $T_{pose}$, counting the number of periods of the clock HNUM during the duration of the VAL_HORLOGEj signal.

The binary words stored in the column counters are therefore, at the end of reading a line, proportional to the duration of the regenerated pulses (VAL_HORLOGEj). In other words, assuming an ideal analog chain, the binary contents of the column counters is proportional to the charge stored in the elementary points of the line read. It is then sufficient to read the contents of the M column counters by means of an Nb bit logic bus before reinitialising the counters so as to proceed to the reading of the following lines.

Taking a synchronous image

Each frame, the impedance matching device switches of all the elementary points are closed in a synchronous manner, the switches of the addressing devices of each elementary point being open.

For each elementary point, the current supplied by the detector is then integrated in the inversion channel of the MOS transistor during a time period $T_{pose}$.

At the end of the exposure time, the impedance matching device switches of all the elementary points are opened in a synchronous manner. Hence the exposure time for each of the detectors is the same.

Sequential line by line reading of the matrix

The lines of detectors are selected one after the other. At each line time, the switches of the addressing devices of the same line are closed. The gates of the MOS storage transistors on the same line are then pulsed in a way that causes the injection of stored charges into their channel on their respective column bus and, as a consequence, the resetting to zero of the stored charge in the inversion channel of the MOS storage transistors.

The column bus is supposedly maintained at a constant potential by a regeneration device whose input impedance is moreover, supposedly infinite. The current pulse thus caused by the charge injection is converted into a signal of the same duration, compatible with those of the command of the counter by the regeneration device. The output from the counter which has ensured the analog-digital conversion, can then be multiplexed to the digital output bus to be processed.

It is then possible to reinitialise the counter, to open the switch of the column addressing device and finally to create a new potential well, empty of all charge, under the gate of the MOS storage transistor before proceeding to the reading of the following line.

The expression for the duration of the current pulse or of the signal coming from the regeneration device $\delta T_{ij}$ connected to the column j as a function of the current $id_{ij}$ supplied by the elementary point detector PEL(i,j) is given by the expression:

$$\delta T_{ij} \times I_{pulse} = Id_{ij} \times T_{pose}$$

where $I_{pulse}$ is the constant amplitude of the current pulses on the column bus.

It must be noted that the amplitude $I_{pulse}$ of the current pulses on the column bus can be optimised by adjusting the rate of change of the decay edge of the clock HCi. In effect the voltage gradient thereby applied to the gate is going to have the effect, in a first approximation, of causing an injection of charge into the column bus, over the potential barrier generated by a transistor Ta, at a constant rate. Thus a pulse of current is obtained whose amplitude is proportional to the integrating capacitance and to the rate of change of the decay edge of HCi. This rate of change of the decay edge of clock HCi(t) must be constant with time and for all the lines.

$\delta T_{ij}$<the decay edge time period of clock HCi.

The numerical value obtained at the counter output is given by the following equation:

$$N_{Num} = \delta T_{ij} \times F_{HNUM} = Id_{ij} \times T_{pose} \times F_{HNUM} / I_{pulse}$$

where $F_{HNUM}$ is the frequency of the clock HNUM of the counter.

Number of bits of the counter

The number of bits (Nb) of the column counter must be such that the encoding dynamic range is compatible with the signal to noise ratio of the charge to be read, referred to below as $(S/B)_q$.

As a first approximation, it is assumed that the signal to noise ratio is given by the following equation:

$$(S/B)_q = (Id \times Tp/q)^{1/2}$$

where Id is the current supplied by the detector, Tp is the exposure time and q the charge of the electron.

A first order of magnitude of Nb is obtained by writing that the number of states of the counter is equal to the charge dynamic range of the elementary point:

$$2^{Nb} = (S/B)_q$$

which finally gives $$Nb = [20 \log_{10}(S/B)_q]/6$$

The following table gives the relationship between the charge dynamic range and the number of bits of the counter:

| Nb | $(S/B)_q$ in dB |
|----|----|
| 8 | 48 |
| 9 | 54 |
| 10 | 60 |
| 11 | 66 |
| 12 | 72 |
| 13 | 78 |
| 14 | 84 |
| 15 | 90 |
| 16 | 96 |

Frequency of the counter

This is the other parameter dimensioning the system since it determines the temporal quantization step for the duration of the pulses. The frequency of the counter clock ($F_{HNUM}$) is obtained by writing that the maximum duration of the current pulse ($\delta T_{ij}^{max}$) is encoded full scale onto the counter:

$$\delta T_{ij}^{max} = 2^{Nb}/F_{HNUM}$$

from which $$F_{HNUM} = 2^{Nb}/\delta T_{ij}^{max}$$

This equation shows clearly that it is necessary to optimise the settings of the clocks HCi in a way that increases $\delta T_{ij}^{max}$ if one wishes to minimise $F_{HNUM}$.

Figure 6:
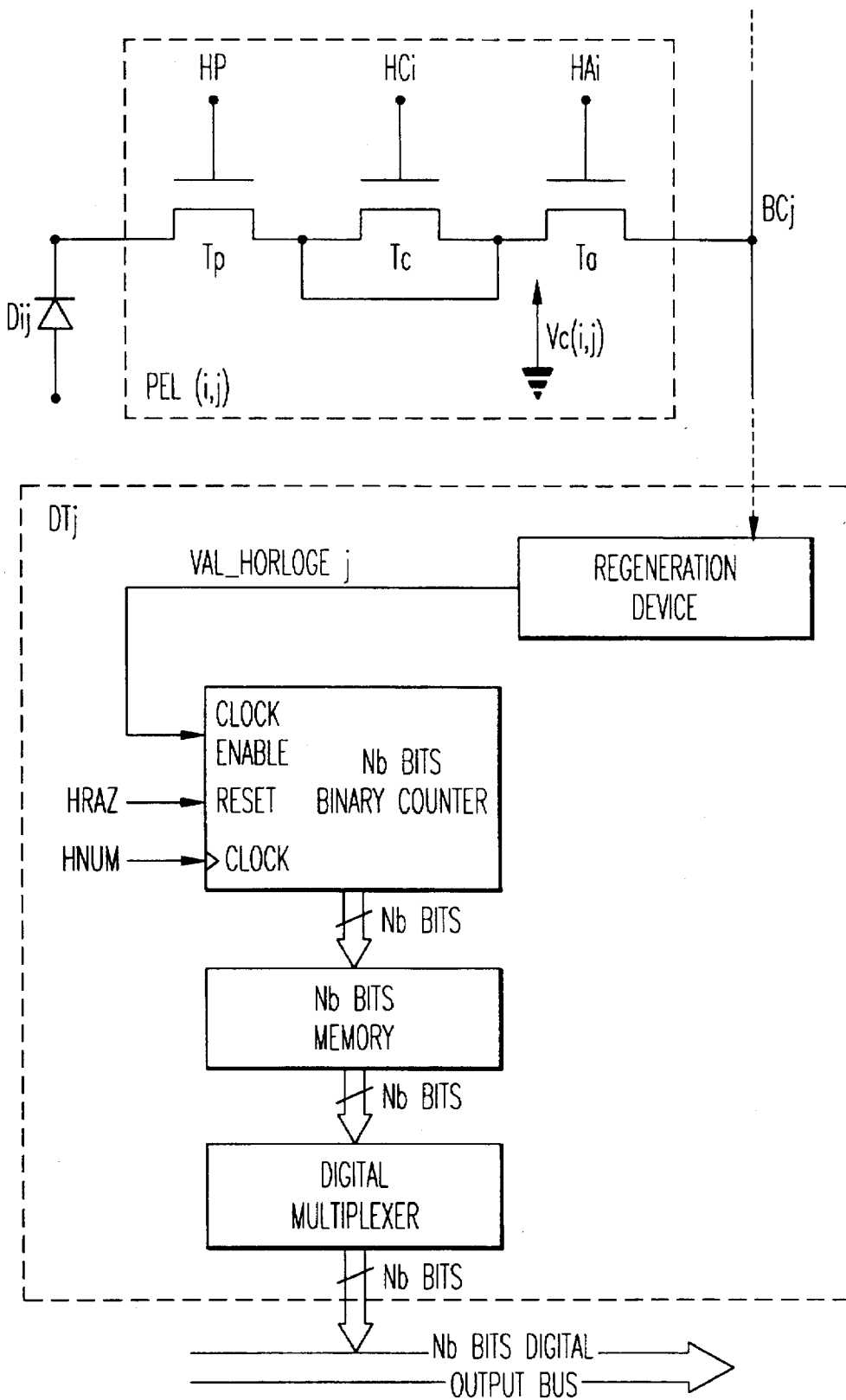
FIG. 6 illustrates an example of producing the device of the invention.
Figure 7A:
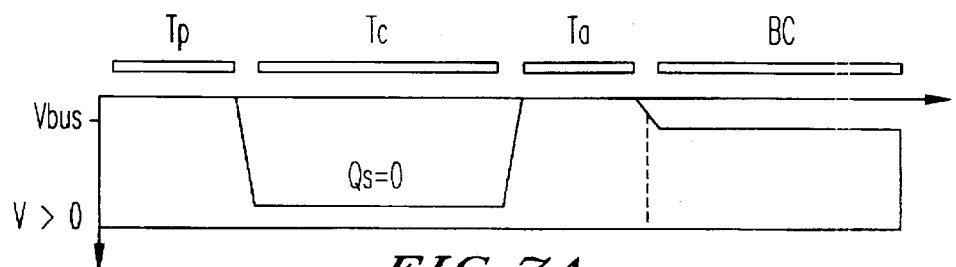
FIG. 7 illustrates the variations, in the course of a complete operating cycle, of the potential profiles in an elementary point according to the invention.
Figure 7B:
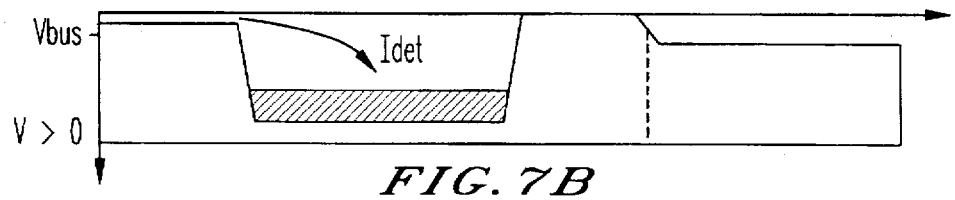
Figure 7C:
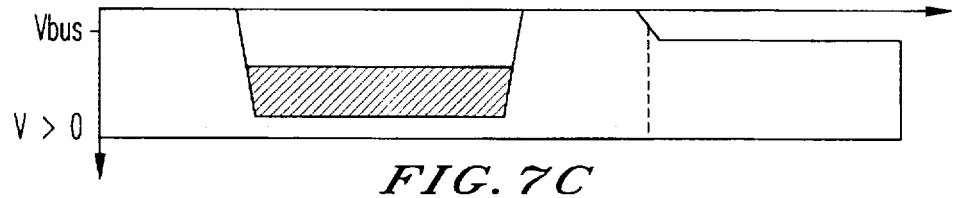
Figure 7D:
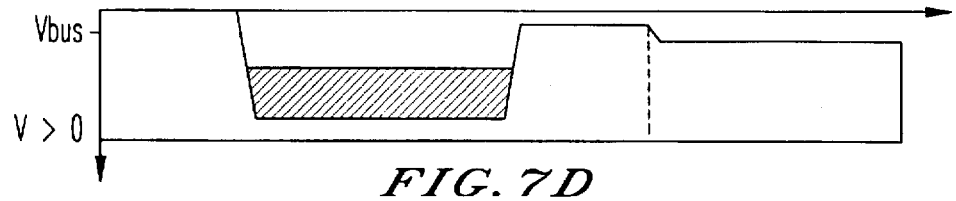
Figure 7E:
Figure 7F:
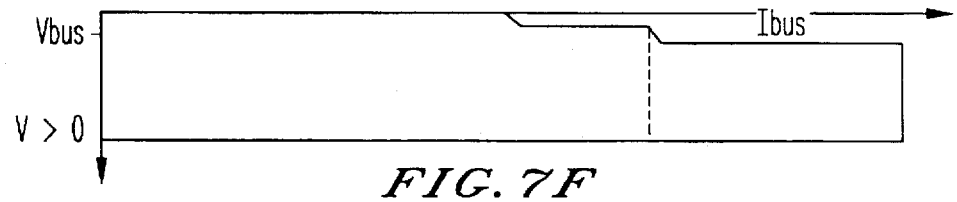
Figure 7G:
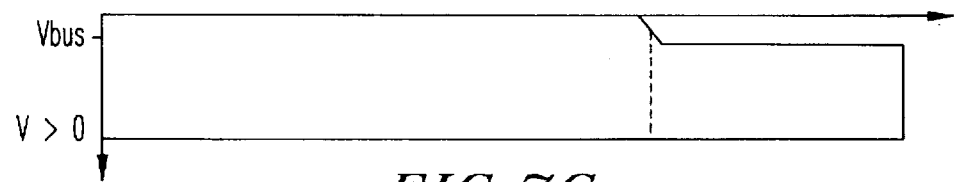

The block diagram of an example of the creation of a reading circuit according to the invention is given in FIG. 6.

This circuit is supposed to read a matrix of detectors N lines by M columns. The elementary point of line i and of column j (PEL(i,j)) is shown. Its output is applied to the column bus BCj which is connected to the regeneration device located at the input of the signal processing device DTj belonging to this column. The output signal from the regeneration device (VAL_HORLOGEj) is compatible with the command signals from a binary counter of Nb bits and it is connected to the validation command (ENABLE) of the clock of this counter (HNUM). The counter carries out the analog-digital conversion of the information. On the counter output, the digital value of the quantity of charge coming from the elementary point processed is therefore available, it only remains to direct it onto the digital output bus through the use of a memory (optional) and a multiplexer.

The operation of the device of the invention is the following:

For taking an image: a first clock HP (common to all the impedance matching devices and all the elementary points) is at the level of the polarisation voltage Vpol, the clocks HCi belonging to each line (i being the number of the line) are at the voltage level allowing the storage of charge and the clocks HAi belonging to each line at the disabling voltage: one time per image, there is an integration of the current supplied by the detector in the MOS transistor (storage) during a time predefined as a function of the illumination conditions of the scene, the characteristics of the detector, the value of the storage capacity. This occurs for all the detectors simultaneously (synchronous reading) because all the clocks HCi and HAi associated with each line i are at the level of voltage allowing storage of charge for clock HCi and at the disabling voltage for clock HAi.

The first clock HP returns to the disabling voltage level. For each line i, the second clock HCi changes from its charge storage voltage to a transistor disabling voltage in a linear fashion (the increase and the decrease being determined in relation to the characteristics of the current regeneration device), and the third clock HAi switches to a V screen level during this change of the second clock HCi. For each elementary point on the same line, there is a step of evacuation of the stored charges for each line of the matrix and simultaneously, an analog-digital conversion of the stored charges for each line of the matrix.

The principle of the analog-digital conversion is the following: the duration of the output signal from the regeneration device of the column j is equal to the duration of the current pulse supplied to the column bus BCj by elementary point PEL(i,j) during the change of the second clock HCi from its charge storage voltage to its transistor disabling voltage, itself proportional to the quantity of charge stored under the MOS transistor of elementary point PEL(i,j). The logic counter j, previously reinitialised by the clock HRAZ, counts the number of periods of clock HNUM during the duration of the signal coming from the regeneration device.

When all the lines have been scanned, the various preceding steps are started again for another image.

The Vscreen voltage is the voltage at which the transistor is enabled but capable of generating a potential barrier between its channel potential and that of the MOS transistor.

The disabling voltage is the voltage applied to the command so that no current whatsoever flows between the input and the output of the device.

The device according to the invention as previously described and as shown in FIGS. 5A, 5B and 6 as an example of its realisation allows usable digital information to be obtained directly by the image processing methods.

The invention allows the conversion of the analog information from the detector, obtained at the output of the MOS transistor into digital information. For this, a counter is added which is triggered as soon as the current pulse is present on the column bus and stops when the pulse is finished.

Each detector DET (i,j) is supposed to be an N-type photovoltaic detector on a P substrate. It is schematised by a diode Dij.

The matching of the impedance between the detector DET(i,j) and the elementary point PEL(i,j) is achieved by a NMOS transistor Tp, here mounted on a common gate which has a low input impedance and a very high output impedance. Its source is connected to the detector and its drain to the source of the NMOS integrating transistor Tc.

This principle of coupling the photovoltaic detectors to their reading circuits is classic and is often referred to by direct injection in the literature. There exists numerous variants intended mainly to decrease the input impedance and/or increase the output impedance.

A clock indicated by HP is applied to the gate of all Tp transistors in the mosaic.

The integrating capacitor C is made here using a NMOS transistor Tc whose source and drain can be short circuited as is the case in FIG. 6.

The source and drain diodes of transistor Tc are connected, on the one hand to the drain of transistor Tp and on the other hand to the input diode of the NMOS addressing transistor Ta.

The clock HCi is connected to the gate of transistor Tc. The index i makes clear that all the Tc transistors in the same line are driven by this clock and that each line of the reading circuit is driven by a different clock.

The NMOS addressing transistor Ta is mounted, as a switch, between the source and/or drain of transistor Tc and the column bus connection BCj. The clock HAi is connected to its gate. The index i makes clear that this clock drives all the Ta transistors in the line and that each line of the reading circuit is driven by a different clock.

The column bus BCj is connected to the input of a regeneration device which ensures the conversion of the current pulse coming from the elementary point PEL(i,j) into a signal compatible with the logic signals used in the binary counter while conforming to the duration of the current pulse. This device also ensures the polarisation of the column bus so that it is kept constant during the duration of current pulses associated with this bus.

Advantageously, this regeneration device can be created with a current-voltage amplifier whose gain is sufficiently large to saturate the amplitude of the output signal at the supply voltages of the amplifier, the supply voltages being compatible with the logic levels of the command signals from the counter.

The binary counter is an Nb bits binary counter which ensures the analog-digital conversion of the information. It has available the following command signals as a minimum:

a counting clock (HNUM);

an input for reinitialisation or pre-setting of the Nb stages that make it up (HRAZ);

a counting clock validation input (VAL_HORLOGEj).

The memory device allows a Nb bits binary word to be memorised after a command signal.

This device is optional but it makes it possible to simultaneously multiplex the M binary words, which represent a line previously processed, to the Nb bit digital output bus and to digitise the M new pieces of information from the new line processed.

The logic multiplexer ensures the multiplexing of the M binary words representing a line to the digital output bus.

Before describing the electrical operation of an elementary point, it is essential to explain the principles which govern the dimensioning of this type of circuit and the adjustment of the different stimuli.

The clocks used to command this circuit are supposedly switched between two analog levels which are not always equal to supply voltages (Vdd, Vss) of the circuits as is often the case. By convention, in the following, the output voltage of the clocks:

in the high state is designated H(1);

in the low state is designated H(0).

The polarising transistor has two functions:

to polarise the detector;

to control the exposure time.

The first function is obtained by applying to the gate of the NMOS transistor, a voltage Vpol such that it is polarised under saturation conditions, that is to say, in a zone where it has a high dynamic drain-source resistance. To do this, in the case that concerns us, it is enough to apply to the gate of transistor Tp, a voltage approximately equal to the threshold voltage Vtn of this MOS transistor.

The second function is obtained by applying to the gate of transistor Tp, a voltage such that transistor Tp is disabled. To do this, in the case that concerns us, it is enough to apply to the gate of transistor Tp a voltage Vtb which guarantees that this does not allow any current to pass, even under low inversion conditions. In practice, it is sufficient to apply the minimum voltage allowed by the die, referred to here as Vss, in order to have sufficient noise margin.

The polarising transistor fulfils it functions if the clock Hp switches between the following levels:

HP(1)≈Vtn;

HP(0)=Vtb≈Vss.

The MOS integrating transistor Tc must be commanded by a clock Hc so that it fulfils the following three functions:

to maximise the storable charge;

to reinitialise its capacitance between two images;

to control, at each reading, the current which will be injected into the regeneration device.

For most applications, it is desirable to maximise the signal to noise ratio from the first stage of the reading circuit onwards, which, in general, comes back to maximising the storable charge in the inversion channel of transistor Tc.

To do this, it is enough to apply to the gate of transistor Tc, the maximum voltage allowed by the die, designated here by Vdd. The maximum storable charge Qsm in the elementary point can then be approximated using the following formula, neglecting the capacitance of the source and drain diodes of transistors Tp, Tc and Ta, and other parasitic capacitances connected to this same electrical node:

$$Qsm = Cox \times S \times (Vdd - Vtn)$$

where

Cox is the capacitance per unit surface area of the Tc gate;

S is the active surface area of the Tc gate;

Vtn is the threshold voltage of the NMOS transistor Vtn.

Reinitialisation of the integrating capacitor is perfect if the voltage applied to the gate of transistor Tc enables the channel in build-up mode. In other words, it is no longer possible to store electrons there. To do this, the voltage must be less than the threshold voltage of transistor Tc. It is often convenient, as for transistor Tp, to use the supply Vss.

To summarise, the clock HCi must, in order to satisfy the two first constraints, be switched between levels:

HCi(1)=Vdd;

Hci(0)=vss.

The regenerating device must satisfy the following constraints:

to supply an output signal of a magnitude (generally voltages) and an amplitude compatible with the logic command signals from the binary counter;

to keep the column bus at a constant potential during the reading of the charges stored in the elementary point;

to consume the least power possible so as to minimise consumption in the reading circuits of large format components.

In the case of the invention, it regenerates the current pulse Ibusj as a signal VAL_HORLOGEj compatible with the command signals from the counter.

It can be shown that the second point is satisfied by using a device where the product gain x band is suited to the rise time of the current pulse which is injected into the bus.

If such were not the case, the duration of the current pulse would have a big chance of no longer being preserved on the VAL_HORLOGEj signal, which would bring about a distortion in the counter during the analog-digital conversion.

The addressing transistor must fulfil three functions:

to guarantee the electrical insulation between the channel of transistor Tc and the column bus so that no charge can be exchanged between the column bus and the integrating capacitor of the relevant elementary point apart from when reading this elementary point;

to not retain a part of the charge injected onto the column bus;

to minimise the rise time of the current pulse induced by this charge transfer.

The first constraint is satisfied by applying to the gate of transistor Ta, a voltage less than its threshold voltage, which has the effect of disabling this transistor. To do this, it is convenient, just as for the polarising transistor, to use power supply Vss as the base level.

The second constraint is achieved by applying to the gate of transistor Ta, a voltage V screen such that the empty channel potential of transistor Tc is slightly less than a voltage Vbus. The potential step thus created between the channel of transistor Tc and the column bus ensures the transfer of all the electrons stored in the channel of transistor Ta. A crude estimation of the voltage to apply consists of writing that the transistor Ta must be enabled, in other words that the gate voltage must be equal to its source voltage, equal to Vbus plus its threshold voltage, taking the substrate effect into account.

It is the third constraint that gives prominence to the fact that transistor Ta must not be considered as a classic switch, in other words the high level of HAi must not be Vdd. In effect, if such were the case, a charge pulse of very short duration would be sent onto the bus when transistor Ta passes from the open circuit state to the closed circuit state. The current pulse induced on the bus would then be of high amplitude and of very short duration which would impose crippling constraints on certain of the electrical characteristics of the regeneration device as well as on the rate of clock HNUM. In order to avoid this phenomenon, it suffices that the channel potential under transistor Ta plays the role of a potential barrier with respect to the charge stored under transistor Tc. To do this, it is necessary and it is enough that the voltage applied to the gate of transistor Ta in the high state exactly satisfies the preceding constraint.

In practice, the levels of clocks HAi are:

HAi(0)=Vss;

HAi(1)=Vbus+VTn(Vbus).

In the course of a complete operating cycle, the changes in the profiles of the potentials in the different MOS transistors of the elementary point are shown in diagrammatic form in FIG. 7. The operating cycle has been split up into seven phases:

Phase A: this phase precedes the exposure time. Tp is disabled. The potential well under Tc exists, but it is empty (Qs=0). Ta is disabled.

Phase B: the elementary point is in the course of integration. Tp is enabled. The current supplied by the detector (Idet) is integrated in the potential well under Tc.

Phase C: this is the end of the exposure time. Tp is disabled, which has the effect of sampling-disabling the potential under Tc Phase D: this is the start of the reading of the elementary point. Only the voltage applied to the gate of Ta is changed in such a way that it is enabled and to create a potential barrier between Tc and the column bus.

Phase E: the charges stored under Tc are injected over the potential barrier created under Ta into the potential well of the column bus.

Phase F: all the charges stored under Tc have been injected into the column bus. The potential well under Tc is empty.

Phase G: this is the end of the reading of the elementary point. Ta is disabled in such a way that it proceeds to reading another elementary point Qr takes another image.

Figure 8:
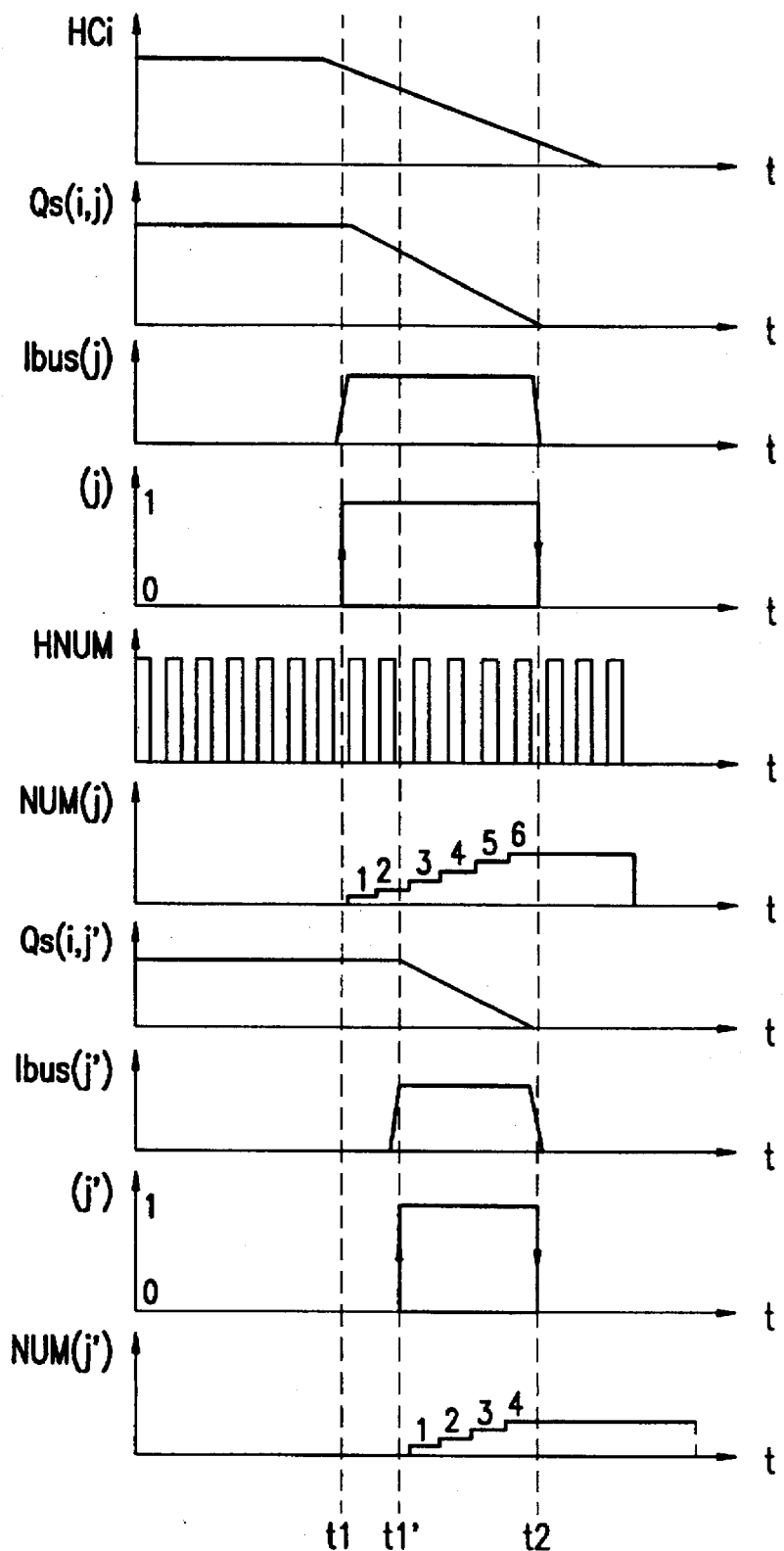
FIG. 8 illustrates a timing diagram of reading two elementary points according to the invention.
Figure 9A:
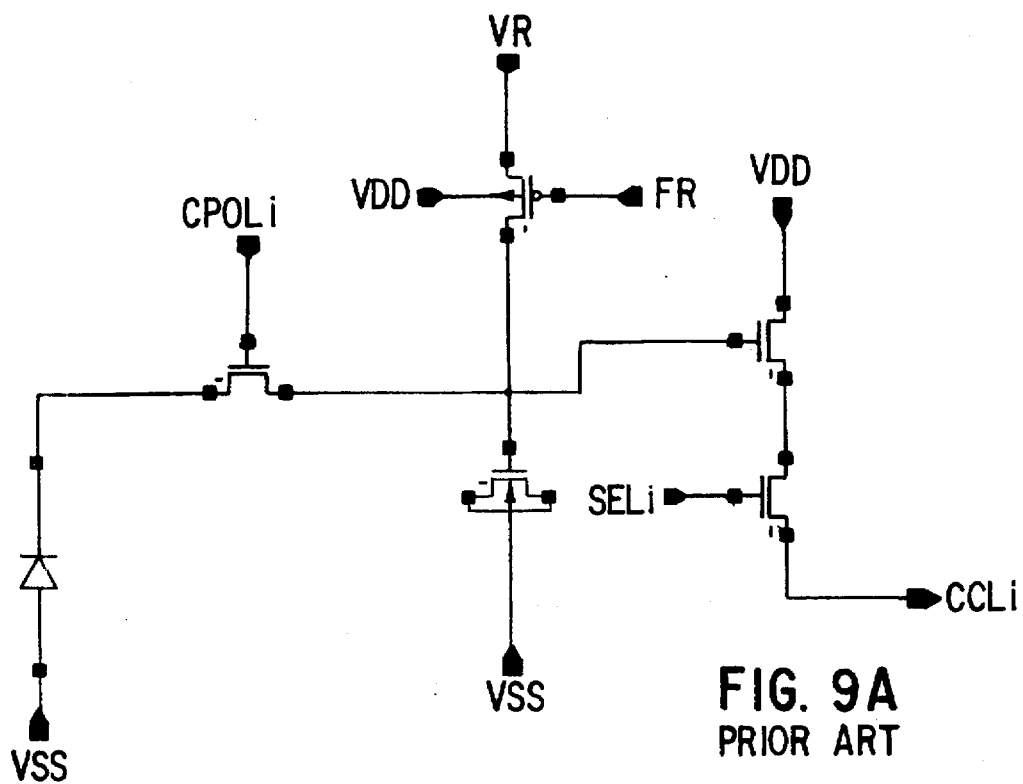
FIGS. 9A, 9B and 10A, 10B illustrate the embedding and the electrical diagram of a two line by two column mosaic of elementary points, respectively for a prior art reading circuit of the switched follower type and for a reading circuit according to the invention.
Figure 9B:
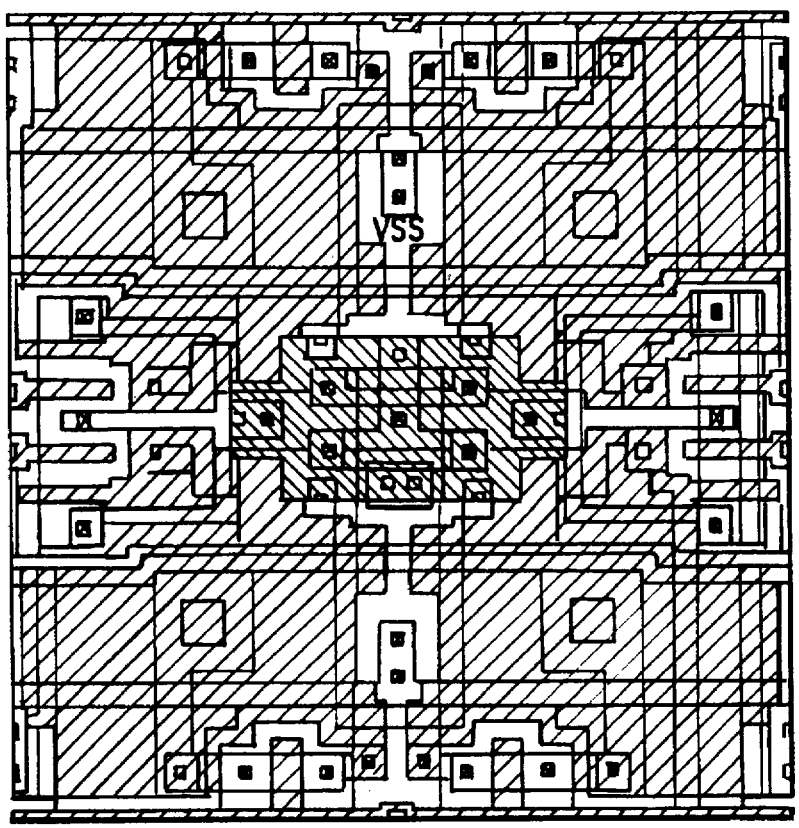
Figure 10A:
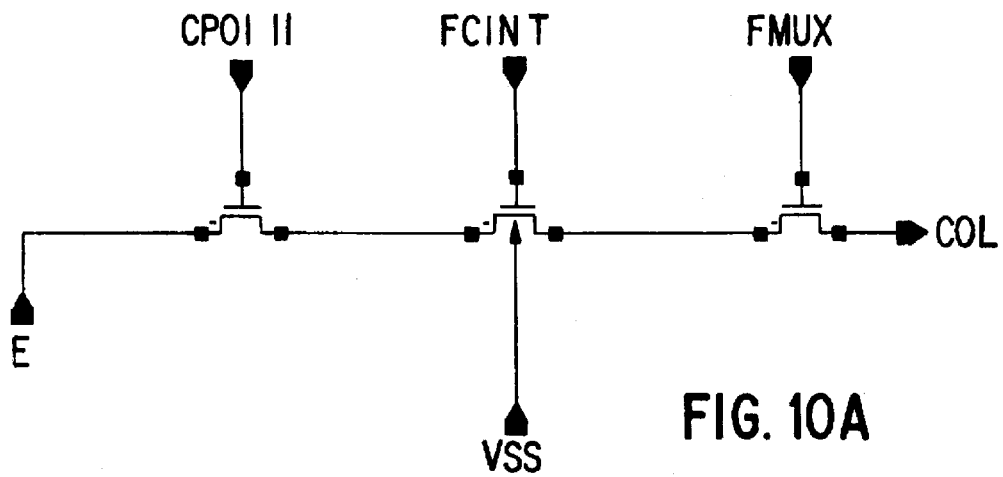
Figure 10B:
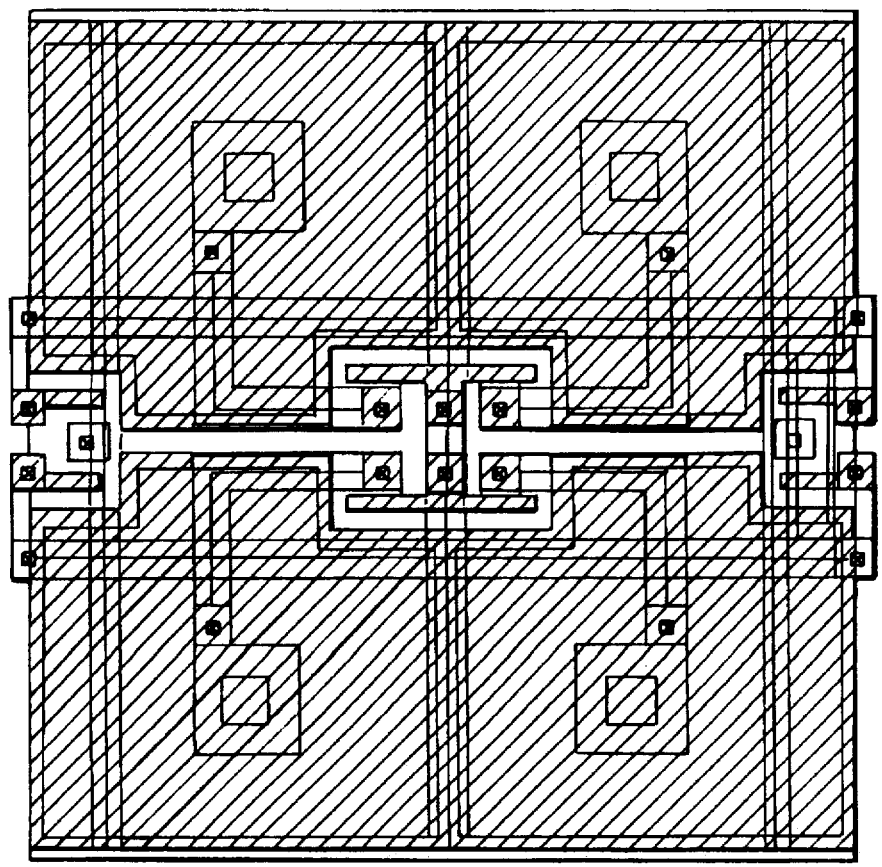

Finally, the curves in FIG. 8 enable better understanding of how certain electrical quantities change in relation to the charge stored in the elementary point. To do this, the charge stored, at the end of the exposure time, in two elementary points in the same line i but in two different columns referred to as j and j' are designated Qs(i,j) and Qs(i,j').

The voltage applied to the gate of the MOS storage transistors Tc of these two elementary points is designated by the clock HCi. It is assumed that the rate of change of its decay edge is constant. The currents injected into the buses of columns j and j' are referred to as Ibus(j) and Ibus(j') respectively. The output voltages of the regeneration devices connected to the column buses j and j' are referred to as VAL_HORLOGE(j) and VAL_HORLOGE(j') respectively.

These curves emphasise that the current injected into the column bus j (respectively j') becomes non-zero from an instant t1 (respectively t1'). These curves show clearly that this instant varies proportionally with the stored charge since the lower this charge is, the more it is necessary that the channel potential under transistor Tc decreases, under the effect of the decrease of the HCi voltage, so that the charges stored under transistor Tc can cross the potential barrier under transistor Ta.

The reading is achieved at the same instant t2 for the two elementary points when the last charges stored in the two elementary points are injected into their respective buses. The currents Ibus(j) and Ibus(j') become zero from instant t2.

The output signals of the regeneration devices validate the counting clock HNUM for their respective counter which counts therefore during the duration of these pulses, the counters being previously reinitialised before the start of counting.

The regeneration devices only modify the amplitude and the size of the current pulses, the duration of the pulses being conserved.

At the end of these pulses, (after instant t2), the counters make available, on their Nb output bits, the numbers of clock pulses counted during the duration of these pulses, these numbers being different to the digital images from the durations of these pulses.

It only remains to read sequentially, the binary words present at the output of the M counters before reinitialising them with a view to reading the following line.

To summarise, it can be considered that the invention packages the current supplied by the quantum detectors and the thermal detectors in the following way:

conversion of the detector current into charge by integration of a duration equal to the exposure time;

conversion of the integrated charge into a current pulse whose:
  amplitude is constant for all the detectors and is adjustable in relation to a stimulus,
  duration varies proportionately as a function of the stored charge;

conversion of the width of this current pulse into a digital value using a binary counter.

Particular Advantages

Exposures

The suggested solution enables one to have an exposure time which is of the same duration and is synchronous for all the elementary points, which is not the case with methods with external integration.

Technological performance, integration density, signal/noise

The possibility of designing an elementary point with the following characteristics:

a limited number of MOS transistors;

MOS transistors of the same type;

the charges stored in the channel of an MOS transistor improve, in a significant way, the technological performance since the number of contacts and interconnections in the elementary point decreases in a significant way for the following reasons:

it is not necessary to interconnect the drain and source of certain MOS transistors of the same type with contacts and metallic interconnections since this can be achieved using diffusions used to produce the source and drain diodes;

it is not necessary to keep to the "latch-up" rules, that is to say, to connect the substrate to the supply Vss and the caisson to the supply Vdd using contacts and various metal interconnections since it is not essential to embed complementary MOS transistors in the elementary point;

it is not necessary to keep to the spacing rules between NMOS and PMOS transistors in the elementary point since it is not essential to embed complementary MOS transistors in the elementary point;

it is not necessary to embed a reset device in the elementary point.

These same technical arguments show that packing efficiency of the elementary point for the proposed solution is greater than or equal to that of other solutions where the current is integrated in the elementary point. In practice, the surface of the storage capacitor that it is possible to design in the elementary point of the proposed solution is greater (in applications with reduced spacing, the storage surface is at least multiplied by a factor of two) than that that would be possible to design in a DTC type architecture or a switched follower type since the number of MOS transistors to be embedded is smaller. Finally, it can be shown that the deviation in potential in the MOS storage transistor is greater than that obtained in an elementary point of the switched follower type.

As a consequence, the storable charge of the proposed solution, hence the signal to noise ratio of the circuit, is greater that that which it is possible to attain when employing the prior art solutions, all operational conditions (for example size, spacing of the elementary points, temperature etc.) being equal.

This is illustrated in FIGS. 9A and 9B, 10A and 10B, where a mosaic of two line by two columns of elementary points of the switched follower type is compared respectively with a mosaic with the same format of elementary points of the SCA type. The electrical diagrams of the two elementary points are shown above the embedding of these units. The two implantations show clearly using constant drawing rules that the implantation using SCA architecture is clearly more simple than that using switched follower architecture. A man skilled in the art will note, in particular, that the SCA solution is clearly superior to the switched follower solution in terms of:

interconnection density;

the number of contacts;

the packing efficiency (active surface/surface of the elementary point).

Analog-digital conversion in the focal plane

The advantages and the applications opened up by analog-digital conversion in the focal plane are numerous:

from these existing digital values, it is possible to envisage a pre-processing of the signal in the focal plane with a view to improving the performance of it (averaging of the data, TDI effect etc.);

the digitalisation of the information means that the dynamic range of the processed signals is no longer limited to the analog dynamic range manageable at the output of a focal plane. This ought to improve the performance of certain devices or to simplify the processing at the output of the focal plane where it was necessary in certain applications to post-accumulate the different information coming from a detector so as to recover the whole of its initial dynamic range, not manageable by the focal plane;

the digitalisation of the information means that the digital signals may be carried into very disturbed electromagnetic environments where analog signals would have been strongly degraded.

Rejection of feeds and command phases

The proposed solution is clearly superior to that provided by switched followers since there is no longer a critical power supply into the elementary point or for re-initialisation of the elementary point as for supplies to the follower.

Furthermore, the potential of each column bus is kept constant by the regeneration device while in switched follower or column bus partition circuits, this potential varies enormously. This characteristic limits capacitive coupling between the various functions embedded in the elementary point. This point is very important since most of the electrical nodes of the elementary point are at high impedance hence very sensitive and since this coupling will increase when the spacing of the detectors decreases.

Finally, it is important to note that in an SCA architecture, the storage capacitors are reinitialised line after line and not simultaneously as for the other solutions, which has the effect of minimising the inrush current in the supplies and, as a consequence relaxes the constraints on the resistances of the supply buses.

Spatial spread

In the solution proposed, the spread of the parameters of the technology are not critical in the elementary point. It suffices that the charge storable in the storage capacitor is sufficiently large.

Reading/Writing

The connections, the switches and the command logic of this architecture ensures electrical continuity, that is to say, a connection of finite resistance, between the elementary points in the same column and the ends of the bus of the relevant column.

They enable, therefore, not only the reading of information stored in the elementary points, but also the individual addressing of these elementary points so as to inject a current and/or a voltage. In other words, by comparison with digital memories, this architecture is of the read-write type and not read only.

The writing mode is usable, in this case, to control certain operators embedded in the elementary point in a way that modifies the transfer function of each elementary point, independently one from the other, and this in a way which can be adapted in the course of operation, if needed.

One can take as an application example a reading circuit called an "current reduction" circuit (see reference [10]). In this type of circuit, a current is subtracted from that of each detector before integration in the elementary point, which allows the charge to be stored to be minimised. This subtraction is carried out using a MOS transistor operating under saturation conditions. In practice, the reduced current in each elementary point is adjusted presenting a uniform scene before the detector. This optoelectric calibration could be replaced by a purely electrical calibration thanks to the writing mode.

Figure 11:
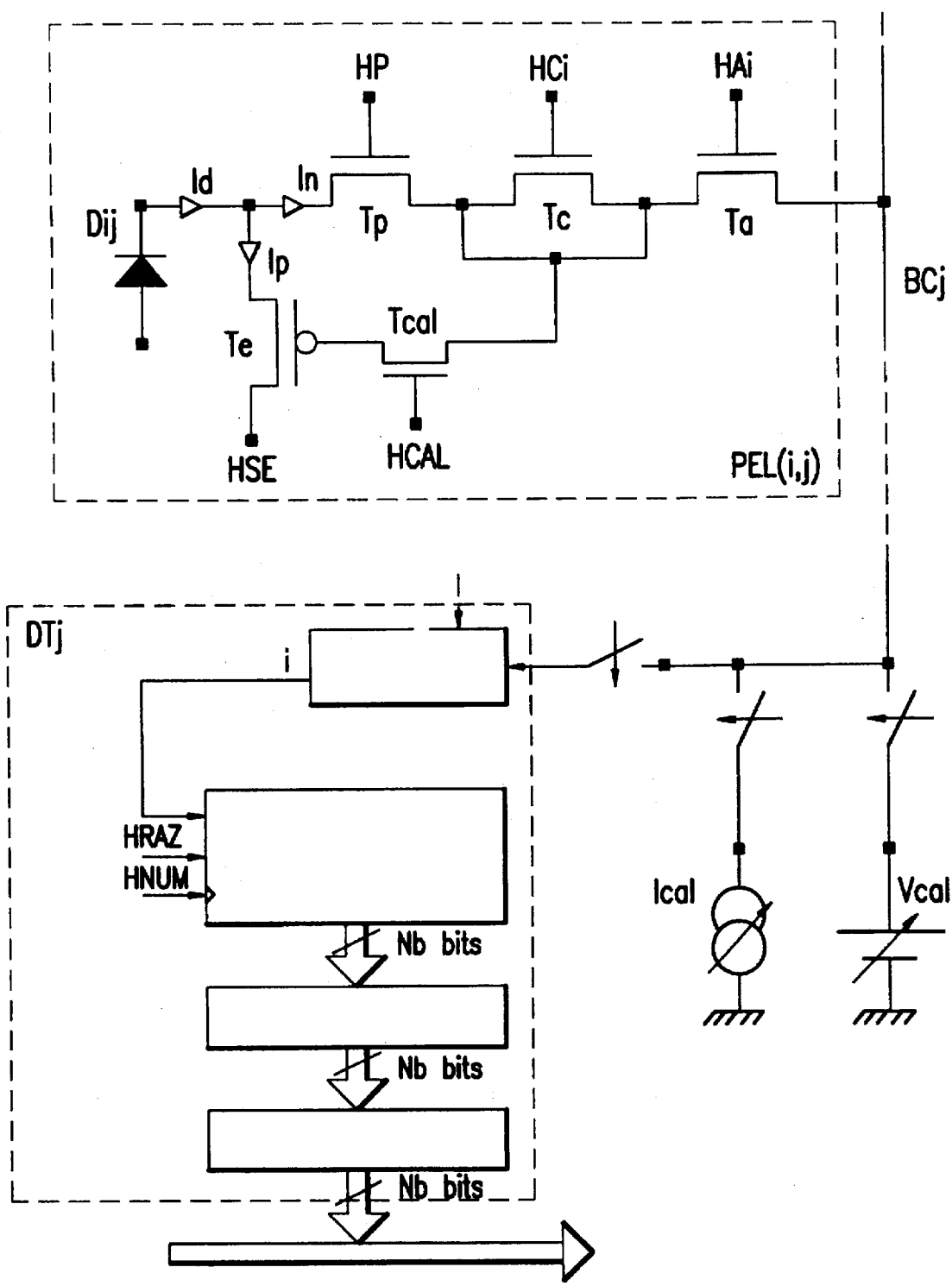
FIG. 11 illustrates the electrical calibration block diagram according to the invention.

In effect, the proposed architecture allows the injection of either a current or a voltage into each elementary point. This is illustrated in FIG. 11. The variable current generator (Ical) or the variable voltage source (Vcal) are switched on the column buses using a demultiplexer, appropriately sequenced. The current reduced by the PMOS transistor Te integrated in the elementary point could be adjusted either by copying Ical in the transistor Te by mirror current techniques or others, or by sampling-disabling on the gate of the transistor Te a voltage Vcal such that the reduced current is equal to the desired value.

It can be seen that it is possible to carry out circuit calibrations while modifying the reduced current intensity, according to the needs of the application and in an independent manner for each elementary point. Such a type of calibration offers the potential for:

a decrease in, or indeed the elimination of optoelectric reference shots;

an adjustment of the reduced current in each elementary point as a function of the illumination received by the detection circuit.

The testability of reading circuits designed with reduced spacing is often limited since the introduction of a specific MOS transistor is made to the detriment of the storable charge, and hence of the performance of the camera.

In the context of a SCA type architecture, it is apparent in FIG. 11 that it is possible to inject into the elementary point a voltage and/or a current which resolves the problem. It is very likely that it is then necessary to modify the high level applied to the gate of the MOS addressing transistor, but that is easily done by a man skilled in the art.

Multi-applications

Because the MOS transistor situated in the elementary point only acts as a reservoir, it is clear that it suffices to have the biggest MOS transistor in the place assigned to the elementary point. Its maximum storable quantity of charge determines, on the one hand the maximum possible exposure times in relation to the currents coming from the different detectors envisaged and on the other hand, the dynamic range potentially manageable by the device, this dynamic range determining the dimensions of the binary counter namely:

its number of bits: $Nb^{max}$;

its maximum rate of operation: $F_{NUM}^{max}$.

$Nb^{max}$ and $F_{NUM}^{max}$ are calculated from equations described previously.

For applications with a smaller dynamic range than that which can be processed by the circuit, it functions correctly without it being necessary to change the rate of the clock $Nb^{max}$ (=$F_{NUM}^{max}$) or modify the adjustment of the rates of variation of the decay time of the clocks HCi.

However, for applications using detectors supplying, at the output of the elementary points, pulses of maximum duration $\delta T_{ij}^{max}$ much lower than the duration of the decay edge of the clock HCi, it would seem sensible to re-optimise the rates of variation of the decay time of the clock HCi so as to extend the duration of the pulses, which allows a reduction of the rate of the clock HNUM of the counters and consequently, to reduce the power consumption of the device. All this is only adjustment and hence does not change, in any way, the architecture of the device.

The block diagram of such a multi-application circuit is hence the same as that of the standard architecture. In other words, the proposed standard architecture allows adaptation to all application of reading detectors which have a dynamic range less than or equal to that storable in the elementary points of the architecture (the rest of the processing chain being dimensioned in accordance with it).

The proposed architecture shows itself to be very versatile. This versatility can not be found in solutions using the charge transfer or column bus partition types of devices which must always be used with the same level of charges. Neither is it to be found in the switched follower architectures, since although it is potentially possible to embed several capacitors in this type of elementary point, it proves generally not to be possible to carry this out because of a lack of space.

Multi spectrum devices

This application can be considered as a sub-section of multi-applications and hence prove, by the same reasoning, the versatility of the proposed architecture for this kind of application.

Scanned linear arrays with TDI reading

There is a category of cameras where the image is formed by optically scanning a mosaic of detectors. The number of lines of this mosaic is a function of the format of the image and its number of columns is such that it allows the signal to noise ratio of the camera to be improved. This is obtained by summing the information supplied by the detectors in the same line of the mosaic at delayed and synchronous instants of the optical scan (this way of reading information is named "Time Delay Integration" in the English literature).

The proposed architecture is a potential solution to the problem of reading this type of mosaic, above all, when the number of columns and the spacing of the detectors are small.

In effect, in a reading circuit of this type, the current from the detectors is first transformed into charge, within the area of the detectors if necessary.

It is then possible, by suitably sequencing the clocks connected to the gates of the storage capacitors to read the charges stored in the elementary points of a line by injecting them successively, that is to say, column after column onto a line bus.

This line bus is connected to the regeneration device which validates clock HNUM of the binary counter which must also be able to be preset in this case. The Nb bits of counter output and its Nb bits of presetting are connected to a memory plane of M binary words of Nb bits, M being the number of intermediate images that must be stored in view of the reconstitution of the images after the TDI effect on all of the detectors in one line.

The TDI effect is obtained by pre-setting the counter at the intermediate sum associated with the image detectors already read, before validating the clock by the pulse coming from the regeneration device linked to the detector read at the time.

At the end of each analog-digital conversion (with instantaneous summation) of the pulse associated with the detector read, the new result at the counter output is:

either transferred onto the digital output bus of the reading circuit in the case where the digitised pulse is that of the last detector associated with the scene;

or re-memorised in the memory while waiting for the summation with the following detector associated with the image.

The number of binary words of the memory M and the rate of the clock HNUM are a function of the number of columns and of other characteristics of the camera.

Hence one has an architecture which carries out the summation in a digital way in contrast to other solutions proposed in the present state of the art where the summation is carried out in an analog way.

The type of summation requires the same type of storage so as to carry out the delayed summation between the information coming from the detectors from a single image. The proposed solution hence allow digital storage of the intermediate results of an image before it has been seen by all of the detectors.

Most TDI type reading circuits are made in a CCD (Charge-Coupled Device) die. They give satisfactory results, but the availability of these dies and their integration densities pose problems above all if one wants to make a TDI over a large number of columns and in a small space.

From one CMOS die, an architecture has been produced which carries out the main functions of the TDI in a digital manner, namely, the summation a binary counter, able to be preset, and storage by means of a logic memory. Within the hypothesis of an analog-digital conversion which is supposedly perfect, the delayed summation carried out digitally does not bring about either degradation or deformation of the result. Furthermore, these different digital cells are easily created while the equivalent analog cells must be capable of analogically managing the information without degrading it by associated noise and without distorting it because of the non-linearity of its transfer function.

Reading circuits of the scanned linear array type, read by TDI are made in a CCD die and those made with classic architecture in CMOS suffer the same limitations as their homologues designed to read the mosaics of non-scanned detectors.

TDI type reading circuits form part of the application field of the proposed architecture for the same reasons as the reading circuits previously described.

Industrial Applications

The potential applications for the type of architecture proposed are the creation of circuits suitable for reading information supplied by quantum detectors and thermal detectors arranged in a matrix, basically when the use calls for an identical and synchronous exposure time for all the detectors.

In its concept, this circuit is particularly polyvalent. In other words, the same reading circuit can be used for relatively different applications, which reduces the cost of development and the cost of production.

This type of reading circuit does not need a specific die. On the contrary, it relies on analog dies developed for the processing of the signal.

The improvement in packing efficiency of the elementary point should allow the development, using dies currently in use, of imagers with higher performance in terms of:

storable charge, for a given space;

complementary functions (one could quote as examples, reduced current functions, the reduction of input impedance, the improvement of the input bandwidth. The devices to be embedded in order to produce these functions are known to men skilled in the art) embedded in the elementary point, for a given storable charge and a given space;

reduced space, for a given storable charge.

The proposed architecture is compatible with random addressing of the elementary points. Hence it allows one or more underlying images to be produced inside the image. It is clear that in view of the versatility of the circuit, it allows modification of the exposure time and/or the frequency of output of the underlying images, all while preserving an optimum signal to noise ratio.

In certain applications, the cameras can be the object of a counter measure such as dazzling by laser. In the case of an attack by a laser pulse, the SCA architecture can be used as a counter counter-measure by using the fact that it can very easily accept two very different exposure times, while preserving its sensitivity. In effect, by changing the exposure time on the reading circuit in a more or less random manner, it is possible to continue to see the target between two pulses. With the proposed architecture this can be envisaged since it suffices to dimension the storage capacitor and the binary counter for the worst case.

This circuit provides a solution for the reading of detection circuits of the multicolour type. In effect, the detectors of these circuits have the particular characteristic of supplying a different current according to the range of the spectrum that they are detecting. It is therefore clear that it suffices to have as many MOS transistors in the elementary point and a binary counter dimensioned for the largest dynamic range processed in order to respond in an optimum manner with the same reading circuit to detectors observing different wavelength ranges. It is possible, by using external adjustments, to optimise, if required, the rate of operation of the binary counter as a function of its own dynamic range to an observed range so as to minimise the power consumption of the device.

Finally, the analog-digital conversion in the focal plane opens up new applications such as the pre-processing of information in the focal plane, the improvement of the dynamic ranges of the signals output from the focal plane and this, independently of possible interference due to an electromagnetic environment or the simplification of the processing of the data coming from the focal plane.

REFERENCES

[1] "256×256 PACE-1 PV HgCdTe focal plane arrays for medium and short wavelength infrared applications" L. J. Kozlowski, K Vural, V. H. Johnson, J. K. Chen, R. B. Bailey and D. Bui; and M. J. Gubala and J. R. Teague (SPIE vol. 1308 Infrared Detectors and Focal Plane Arrays, 1990).

[2] "Status and direction of PACE-I HgCdTe FPAs for astronomy" L. J. Kozlowski, K. Vural, D. Q. Bui, R. B. Bailey, D. E. Cooper and D. M. Stephenson (SPIE Vol. 1946 Infrared Detectors and instrumentation, 1993).

[3] "Evaluation of the SBRC 256×256 InSb focal plane array and preliminary specifications for the 1024×1024 InSb focal plane array" A. M. Fowler and J. Heynssens (SPIE Vol. 1946 Infrared Detectors and instrumentation, 1993).

[4] "p-channel MIS double metal process InSb monolithic cell for infrared imaging" A. Kepten, Y. Shacham-Diamand and S. E. Schacham (SPIE vol. 1685 Infrared Detectors and Focal Plane Arrays II, 1992).

[5] "Practical design considerations in achieving high performance from infrared hybrid focal plane arrays" R. A. Ballingall and I. D. Blenkinsop; and I. M. Baker and J. Parsons (SPIE Vol. 819 Infrared Technology XIII, 1987)

[6] "High performance 5 µm 640×640 HgCdTe on sapphire focal plan arrays" L. J. Kozlowski, R. B. Bailey, S. A. Cabelli, D. E. Cooper, I. S. Gergis, A. Chiyi Chen, W. V. Mclevige, G. L. Bostrup, K. Vural, W. E. Tennant and P. E. Howard (Optical Engineering 33(1), 54–63, January 1994)

[7] "Design of a low light level image sensor with on-chip sigma-delta analog to digital conversion" S. R. Mendis, B. Pain, R. H. Nixon and E. R. Fossum (SPIE 1900, page 31).

[8] "Approaches and analysis for on focal plane analog to digital conversion" B. Pain, E. R. Fossum (SPIE volume 2226, Infrared Readout Electronics II, 1994, page 208.

[9] "On focal plane analog to digital conversion with detector gain and offset compensation" D. E. Ludwig, N. D. Woodall and M. M. Spanish (SPIE volume 1097, Materials, Devices, Techniques and Applications for Z-plane Focal Plane Array (FPA) Technology, 1989. pages 73 to 84).

[10] French Patent Application Number 88 10375 "Système de détection d'informations sous forme de rayonnement électromagnétioque et de lecture des informations détectées" (A system for detecting information in the form of electromagnetic radiation and for reading the detected information).

We claim:

1. A digitizing device for a column of photosensitive detectors in a matrix of photosensitive detectors arranged in columns and rows, each photosensitive detector having an identical exposure time and supplying a current whose intensity varies as a function of an incident flux, and each photosensitive detector in a row of photosensitive detectors being activated simultaneously, the digitizing device comprising:

a column bus;

plural elementary points, each of the plural elementary points including:

an impedance matching device coupled to a corresponding photosensitive detector in the column of photosensitive detectors, the impedance matching device receiving a current supplied by the corresponding photosensitive detector during a first clock signal, at least one MOS transistor for storing charge, the at least one MOS transistor including a gate input receiving a second clock signal for integrating the current supplied by the corresponding photosensitive detector, and an addressing device for selectively coupling the at least one MOS transistor to the column bus during a third clock signal and for controlling conversion of the current supplied by the corresponding photosensitive detector into a current pulse during evacuation;

a regeneration device for receiving the current pulse from each of the plural elementary points, one at a time, and outputting a regenerated signal;

a counter receiving the regenerated signal and a fourth clock signal for producing a binary signal; and a device for reading the binary signal.

2. The digitizing device according to claim 1, wherein the photosensitive detectors comprises at least one of a quantum detector and a thermal detector.

3. The digitizing device according to claim 1, wherein the photosensitive detectors are produced on a first substrate, and wherein the regeneration device is produced on a second substrate.

4. The digitizing device according to claim 1, wherein the photosensitive detectors are created directly on the regeneration device.

5. The digitizing device according to claim 1, wherein the impedance matching device comprises an input connected the corresponding photosensitive detector, an output connected to at least one of a source and a drain of the at least one MOS transistor and a command input connected to the first clock signal which switches between a disabling voltage and polarization voltage, wherein the at least one MOS transistor comprises a gate connected to the second clock signal which, when switched to a first voltage, integrates the current supplied by the photosensitive detector and stores a charge obtained, and when switched to a second voltage evacuates the stored charge onto the column bus;

wherein the addressing device comprises an input connected to the at least one of the source and drain of the at least one MOS transistor, an output connected to the column bus, and a command input connected to the third clock signal which switches between a disabling voltage and an addressing voltage at which the addressing device is enabled, wherein the regeneration device comprises an input connected to the column bus and output connected to the counter; and wherein the counter comprises an output connected to the device for reading the digitized signal.

6. The digitizing device according to claim 5, further comprising a data storage device connected between the counter and the device for reading the digitized signal.

7. The digitizing device according to claim 6, wherein the storage device is a RAM.

8. The digitizing device according to claim 1, wherein the regeneration device is a current/voltage amplifier.

9. The digitizing device according to claim 1, wherein the impedance matching device is an MOS($T_P$) transistor.

10. A method of reading photosensitive detectors, making use of the device according to any one of claims 1 to 9, comprising the steps of:

converting a current from a first photosensitive detector of the photosensitive detectors into charge by integration of a duration equal to an exposure time;

converting the integrated charge into a current pulse having a constant amplitude for each of the at least one photosensitive detectors but adjustable in relation to a stimulus, and having a duration that varies proportionately as a function of the stored charge; and converting a width of the current pulse into a digital value using a binary counter.

11. The method according to claim 10, comprising, for each image, the steps of:

a first step of taking an image during which, once per image, a first clock signal common to all the impedance matching devices of all the elementary points is at the level of the polarization voltage, the second clock signal belonging to each line at a voltage level allowing storage of charge and the third clock signal belonging to each line being at a disabling voltage, and simultaneously for each of the photosensitive detectors, integrating in the at least one MOS transistor the current supplied by the corresponding photosensitive detector during a predefined time;

a second step, comprising the sub-steps of:

returning the first clock signal to a disabling voltage level, for each line, changing the second clock, in a linear fashion, from a charge storage voltage to a transistor disabling voltage, switching the third clock signal to a Vscreen level during the changing of the second clock, evacuating, for each of the elementary points on one line, the stored charges; and a third step of converting from analog-to-digital by counting a number of fourth clock pulses corresponding to a duration of the regenerated signal equal to a duration of the current pulse supplied to the corresponding column bus by a corresponding elementary point during the changing of the second clock from the charge storage voltage to the transistor disabling voltage, wherein a time for the changing is proportional to a quantity of charge stored under the at least one MOS transistor of the corresponding elementary point.

12. The method according to claim 10, comprising, for each image, the steps of:

a) one time per image, integrating a current supplied by a corresponding one of the photosensitive detectors and stored in a storage device during a time predefined as a function of illumination conditions, characteristics of the corresponding detector, and a value of a storage capacitance; and b) evacuating the charges for each line of the matrix.

13. A digitizing device for a photosensitive detector in a linear array of photosensitive detectors, each photosensitive detector having an identical exposure time and supplying a current whose intensity varies as a function of an incident flux, and none of the photosensitive detectors having a common connection, the digitizing device comprising:

plural elementary points, each of the plural elementary points including:

an impedance matching device coupled to a corresponding photosensitive detector in the linear array of photosensitive detectors, the impedance matching device receiving a current supplied by the corresponding photosensitive detector during a first clock signal, at least one MOS transistor for storing charge, the at least one MOS transistor including a gate input receiving a second clock signal for integrating the current supplied by the corresponding photosensitive detector, and an addressing device for selectively coupling the at least one MOS transistor to an evacuation output during a third clock signal and for controlling conversion of the current supplied by the corresponding photosensitive detector into a current pulse during evacuation;

plural regeneration devices, a number of elementary points equal in number to a number of the plural regeneration devices, each of the plural regeneration devices receiving the current pulse from a corresponding plural elementary point and outputting a corresponding regenerated signal;

plural counters, the number of elementary points equal in number to a number of the plural counters, each of the plural counters receiving the corresponding regenerated signal and a fourth clock signal for producing a corresponding binary signal; and a multiplexer for receiving each of the corresponding binary signals in turn.

* * * * *